US011789546B2

(12) United States Patent
Xing

(10) Patent No.: US 11,789,546 B2
(45) Date of Patent: Oct. 17, 2023

(54) TOUCH KEY ASSEMBLY, CONTROL CIRCUIT, AND ELECTRONIC DEVICE

(71) Applicant: Huawei Technologies Co., Ltd., Shenzhen (CN)

(72) Inventor: Zengping Xing, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/606,267

(22) PCT Filed: Apr. 23, 2020

(86) PCT No.: PCT/CN2020/086338
§ 371 (c)(1),
(2) Date: Oct. 25, 2021

(87) PCT Pub. No.: WO2020/216278
PCT Pub. Date: Oct. 29, 2020

(65) Prior Publication Data
US 2022/0214754 A1 Jul. 7, 2022

(30) Foreign Application Priority Data
Apr. 25, 2019 (CN) .......................... 201910339870.4

(51) Int. Cl.
G06F 3/023 (2006.01)
G06F 3/02 (2006.01)
H03K 17/96 (2006.01)
(52) U.S. Cl.
CPC ............ G06F 3/023 (2013.01); G06F 3/0202 (2013.01); H03K 17/964 (2013.01)

(58) Field of Classification Search
CPC ..... G06F 3/023; G06F 3/0202; H03K 17/964; H03K 2217/96003; H03K 2217/96015; H03K 2217/96062
See application file for complete search history.

(56) References Cited

U.S. PATENT DOCUMENTS 4,546,658 A 10/1985 Rocha et al.
4,634,917 A 1/1987 Dvorsky et al.
(Continued)

FOREIGN PATENT DOCUMENTS

CN 102645292 A 8/2012
CN 105045430 A 11/2015
(Continued)

OTHER PUBLICATIONS

Kaoru Tashiro et al, "Realization of Button Click Feeling by Use of Ultrasonic Vibration and Force Feedback," Third Joint Eurohaptics Conference and Symposium on Haptic Interfaces for Virtual Environment and Teleoperator Systems ,Salt Lake City, UT, USA, Mar. 18-20, 2009, 6 pages.
(Continued)

Primary Examiner — Amit Chatly
(74) Attorney, Agent, or Firm — Conley Rose, P.C.

(57) ABSTRACT

An electronic device includes a sensor and a control circuit. The control circuit is configured to output a drive signal ($S_d$) to a first port of the sensor in a first time interval and output a high-impedance state or a floating state in a second time interval. The $S_d$ is used to drive the sensor to vibrate along with an outer housing. The sensor is configured to detect the vibration of the outer housing and output a vibration sensing signal ($S_z$) by using the first port. The $S_z$ is a vibration coda wave response signal output by the sensor after the sensor receives the $S_d$.

20 Claims, 11 Drawing Sheets

(56) References Cited

U.S. PATENT DOCUMENTS

| | | | |
|---|---|---|---|
| 5,673,041 | A | 9/1997 | Chatigny et al. |
| 8,887,582 | B2 | 11/2014 | Suzuki |
| 2011/0102326 | A1* | 5/2011 | Casparian .............. H01H 13/85 |
| | | | 340/407.2 |
| 2012/0204656 | A1 | 8/2012 | Suzuki |
| 2015/0234446 | A1* | 8/2015 | Nathan ................ G06F 3/0445 |
| | | | 345/174 |
| 2017/0003253 | A1* | 1/2017 | Kaneko ................. G01H 11/08 |
| 2017/0090599 | A1 | 3/2017 | Kuboyama et al. |
| 2017/0310321 | A1 | 10/2017 | Toda et al. |
| 2018/0101711 | A1 | 4/2018 | D'Souza et al. |
| 2018/0224998 | A1 | 8/2018 | Morofuji et al. |
| 2019/0107902 | A1 | 4/2019 | Kao |
| 2019/0235629 | A1* | 8/2019 | Hu .......................... G06F 3/016 |
| 2020/0100856 | A1* | 4/2020 | Hongo .................... B25J 13/02 |

FOREIGN PATENT DOCUMENTS

| | | | |
|---|---|---|---|
| CN | 106155421 | A | 11/2016 |
| CN | 106321953 | A | 1/2017 |
| CN | 109313492 | A | 2/2019 |
| CN | 110138372 | A | 8/2019 |
| EP | 3113365 | A2 | 1/2017 |
| JP | H07282699 | A | 10/1995 |
| JP | 2004258851 | A | 9/2004 |
| JP | 2009232356 | A | 10/2009 |
| JP | 2017017677 | A | 1/2017 |
| JP | 2017510945 | A | 4/2017 |

OTHER PUBLICATIONS

Guan Rui, "Capacitive Touch Button Research and Implementation of the Calibration Method," Wuhan Institute of Technology, 2013, Issue 06, 2 pages (abstract).

* cited by examiner

TOUCH KEY ASSEMBLY, CONTROL CIRCUIT, AND ELECTRONIC DEVICE

CROSS-REFERENCE TO RELATED APPLICATIONS

This is a National Stage of International Patent Application No. PCT/CN2020/086338 filed on Apr. 23, 2020, which claims priority to Chinese Patent Application No. 201910339870.4 filed on Apr. 25, 2019. Both of the aforementioned applications are hereby incorporated by reference in their entireties.

TECHNICAL FIELD

This application relates to the field of electronic products, and in particular, to a touch key assembly, a control circuit, and an electronic device.

BACKGROUND

With development of mobile device technologies, integration becomes a trend, thereby gaining great advantages in terms of waterproofing and user experience. As obstacles to integration of mobile devices, physical keys are to be gradually replaced with virtual keys. However, the virtual keys are also faced with many problems to be resolved. For example, the virtual keys are likely to be accidentally triggered by users, and input costs need to be considered in mass industrial production of devices. Therefore, how to implement low-cost virtual keys is an issue that urgently needs to be addressed in the industry.

SUMMARY

This application provides a touch key assembly, a control circuit, and an electronic device, to simplify a circuit and reduce costs.

According to a first aspect, an electronic device is provided, including a sensor and a control circuit. The control circuit is configured to output a drive signal $S_d$ to a first port of the sensor in a first time interval, and output a high-impedance state or a floating state in a second time interval. The drive signal $S_d$ is used to drive the sensor to vibrate along with an outer housing. The sensor is configured to detect the vibration of the outer housing and output a vibration sensing signal $S_z$ by using the first port. The vibration sensing signal $S_z$ is a vibration coda wave response signal output by the sensor after the sensor receives the drive signal $S_d$. The control circuit is further configured to detect the vibration sensing signal $S_z$ in the second time interval, and determine, based on the vibration sensing signal $S_z$, whether to trigger an event.

In this embodiment of this application, the control circuit outputs an intermittent drive signal $S_d$ to the sensor, and detects the vibration coda wave response signal in a time interval in which no drive signal $S_d$ is output. In this detection mode, one device of a sensor can perform a driving function and a detection function in different time periods, so that a sensor with a single unit can be used to implement a touch key function, thereby simplifying a circuit and reducing costs.

With reference to the first aspect, in a possible implementation of the first aspect, the control circuit is specifically configured to alternately output the drive signal $S_d$ and the high-impedance state in time domain, or alternately output the drive signal $S_d$ and the floating state in time domain.

With reference to the first aspect, in a possible implementation of the first aspect, the control circuit further includes a first amplification unit, configured to amplify the vibration sensing signal $S_z$.

In this embodiment of this application, the first amplification unit is disposed, so that the control circuit may amplify the vibration sensing signal $S_z$ output by the sensor. This helps more accurately and sensitively determine whether to trigger an event, thereby improving sensitivity and accidental triggering prevention performance of the electronic device.

With reference to the first aspect, in a possible implementation of the first aspect, the control circuit further includes a filter unit, and the filter unit is configured to perform filtering processing on the vibration sensing signal $S_z$.

In this embodiment of this application, high-pass filtering on the vibration sensing signal $S_z$ may be implemented by using the filter unit, so that a baseline of the vibration sensing signal $S_z$ can be stabilized, and detection efficiency of the electronic device is improved.

With reference to the first aspect, in a possible implementation of the first aspect, the sensor is further configured to detect a force or a deformation, and output a force sensing signal $S_f$ by using the first port of the sensor. The control circuit is further configured to detect the force sensing signal $S_f$ and determine whether the force sensing signal $S_f$ meets an active starting condition, and transmit the drive signal $S_d$ to the sensor when the force sensing signal $S_f$ meets the active starting condition.

In this embodiment of this application, the control circuit transmits the drive signal only when the force sensing signal $S_f$ meets a preset condition, so that the control circuit does not need to continuously transmit the drive signal, thereby reducing power consumption.

With reference to the first aspect, in a possible implementation of the first aspect, the control circuit further includes a second amplification unit, configured to amplify the force sensing signal $S_f$.

In this embodiment of this application, the second amplification unit is disposed, so that the control circuit may amplify the force sensing signal $S_f$ output by the sensor. This helps more accurately and sensitively determine whether to trigger an event, thereby improving sensitivity and accidental triggering prevention performance of the electronic device.

With reference to the first aspect, in a possible implementation of the first aspect, the control circuit is specifically configured to: determine whether the force sensing signal $S_f$ meets a calculation starting condition, and when the force sensing signal $S_f$ meets the calculation starting condition, calculate, based on the force sensing signal $S_f$, a force and/or an accelerating force sensed by the sensor; and determine whether the force and/or the accelerating force meet/meets the active starting condition, and transmit the drive signal $S_d$ to the sensor when the force and/or the accelerating force meet/meets the active starting condition.

In this embodiment of this application, the control circuit starts to calculate a force and/or an accelerating force only when the force sensing signal $S_f$ meets a preset condition. Therefore, the control circuit does not need to continuously perform a function of calculating a force and/or an accelerating force, thereby reducing power consumption.

With reference to the first aspect, in a possible implementation of the first aspect, the control circuit is specifically configured to: when the force sensing signal $S_f$ meets a calculation starting condition, start an interrupt program; and after the interrupt program is started, calculate, based on the force sensing signal $S_f$, a force and/or an accelerating force sensed by the sensor, determine whether the force and/or the accelerating force meet/meets the active starting condition, and transmit the drive signal $S_d$ to the sensor when the force and/or the accelerating force meet/meets the active starting condition.

In this embodiment of this application, the control circuit includes an interrupt circuit, and the control circuit starts to calculate a force and/or an accelerating force only when the interrupt program is started. Therefore, the control circuit does not need to continuously perform a function of calculating a force and/or an accelerating force, thereby reducing power consumption.

With reference to the first aspect, in a possible implementation of the first aspect, the sensor includes an electrical or magnetic deformation-reversible device.

With reference to the first aspect, in a possible implementation of the first aspect, the sensor is a piezoelectric device.

With reference to the first aspect, in a possible implementation of the first aspect, the sensor includes the first port and a second port, and the second port is a common end.

With reference to the first aspect, in a possible implementation of the first aspect, the control circuit is a processing chip of the electronic device.

With reference to the first aspect, in a possible implementation of the first aspect, the control circuit is a control chip of the sensor.

With reference to the first aspect, in a possible implementation of the first aspect, the outer housing is a part of a housing of the electronic device.

With reference to the first aspect, in a possible implementation of the first aspect, the outer housing is an outer housing of the sensor.

According to a second aspect, a control circuit is provided. The control circuit is configured to output a drive signal $S_d$ to a first port of a sensor in a first time interval, and output a high-impedance state or a floating state in a second time interval. The drive signal $S_d$ is used to drive the sensor to vibrate. The control circuit is further configured to detect, in the second time interval, a vibration sensing signal $S_z$ output by the sensor by using the first port, and determine, based on the vibration sensing signal $S_z$, whether to trigger an event. The vibration sensing signal $S_z$ is a vibration coda wave response signal output by the sensor after the sensor receives the drive signal $S_d$.

In this embodiment of this application, the control circuit outputs an intermittent drive signal $S_d$ to the sensor, and detects the vibration coda wave response signal in a time interval in which no drive signal $S_d$ is output. In this detection mode, one device of a sensor can perform a driving function and a detection function in different time periods, so that a sensor with a single unit can be used to implement a touch key function, thereby simplifying a circuit and reducing costs.

With reference to the second aspect, in any possible implementation of the second aspect, the control circuit is specifically configured to alternately output the drive signal $S_d$ and the high-impedance state in time domain, or alternately output the drive signal $S_d$ and the floating state in time domain.

With reference to the second aspect, in any possible implementation of the second aspect, the control circuit includes a first amplification unit, and the first amplification unit is configured to amplify the vibration sensing signal $S_z$.

With reference to the second aspect, in any possible implementation of the second aspect, the control circuit further includes a filter unit, and the filter unit is configured to perform filtering processing on the vibration sensing signal $S_z$.

With reference to the second aspect, in any possible implementation of the second aspect, the control circuit is further configured to: receive a force sensing signal $S_f$ output by the sensor by using the first port, where the force sensing signal $S_f$ is used to indicate a force or a deformation detected by the sensor; and determine whether the force sensing signal $S_f$ meets an active starting condition, and transmit the drive signal $S_d$ to the sensor when the force sensing signal $S_f$ meets the active starting condition.

With reference to the second aspect, in any possible implementation of the second aspect, the control circuit further includes a second amplification unit, configured to amplify the force sensing signal $S_f$.

With reference to the second aspect, in any possible implementation of the second aspect, the control circuit is specifically configured to: determine whether the force sensing signal $S_f$ meets a calculation starting condition, and when the force sensing signal $S_f$ meets the calculation starting condition, calculate, based on the force sensing signal $S_f$, a force and/or an accelerating force sensed by the sensor; and determine whether the force and/or the accelerating force meet/meets the active starting condition, and transmit the drive signal $S_d$ to the sensor when the force and/or the accelerating force meet/meets the active starting condition.

With reference to the second aspect, in any possible implementation of the second aspect, the control circuit is specifically configured to: when the force sensing signal $S_f$ meets a calculation starting condition, start an interrupt program; and after the interrupt program is started, calculate, based on the force sensing signal $S_f$, a force and/or an accelerating force sensed by the sensor, determine whether the force and/or the accelerating force meet/meets the active starting condition, and transmit the drive signal $S_d$ to the sensor when the force and/or the accelerating force meet/meets the active starting condition.

With reference to the second aspect, in any possible implementation of the second aspect, the control circuit is a processing chip of the control circuit.

With reference to the second aspect, in any possible implementation of the second aspect, the control circuit is a control chip of the sensor.

With reference to the second aspect, in any possible implementation of the second aspect, the control circuit and the sensor are disposed in an electronic device, and the outer housing is a part of a housing of the electronic device.

With reference to the second aspect, in any possible implementation of the second aspect, the outer housing is an outer housing of the sensor.

According to a third aspect, a touch key assembly is provided, including a sensor, an outer housing, and the control circuit according to any one of the second aspect or the implementations of the second aspect. The drive signal $S_d$ is used to drive the sensor to vibrate along with the outer housing.

According to a fourth aspect, an electronic device is provided, including the touch key assembly according to the third aspect. The outer housing is attached to or integrated with a housing of the electronic device.

According to a fifth aspect, a control method applied to an electronic device is provided. A sensor of the electronic device is attached to an outer housing. The method includes, driving the outer housing to vibrate in a first time interval, and outputting a high-impedance state or a floating state to the outer housing in a second time interval, and when a characteristic of the vibration of the outer housing falls within a range of a user triggering habit, determining to trigger an event.

With reference to the fifth aspect, in a possible implementation of the fifth aspect, the outer housing is an outer housing of the electronic device.

With reference to the fifth aspect, in a possible implementation of the fifth aspect, the outer housing is an outer housing of the sensor.

According to a sixth aspect, a chip is provided. The chip includes the control circuit according to any one of the second aspect or the implementations of the second aspect.

According to a seventh aspect, an electronic device is provided, including: a sensor, where the sensor includes a driving unit and a vibration sensing unit, the driving unit is configured to receive a drive signal $S_d$ and drive the outer housing to vibrate, the vibration sensing unit is configured to detect the vibration of the outer housing and output a vibration sensing signal $S_z$, the vibration sensing signal $S_z$ is a vibration coda wave response signal output after the drive signal $S_d$ is received, and the driving unit and the vibration sensing unit are one device; and a control circuit, configured to output the drive signal $S_d$ to the driving unit in a first time interval, and output a high-impedance state or a floating state in a second time interval. The control circuit is further configured to detect the vibration sensing signal $S_z$ in the second time interval, and determine, based on the vibration sensing signal $S_z$, whether to trigger an event.

With reference to the seventh aspect, in a possible implementation of the seventh aspect, the control circuit includes a signal generation unit and a detection unit. The signal generation unit is configured to alternately output the drive signal $S_d$ and the high-impedance state in time domain, or alternately output the drive signal $S_d$ and the floating state in time domain. The detection unit is configured to detect the vibration sensing signal $S_z$, and determine, based on the vibration sensing signal $S_z$, whether to trigger an event.

With reference to the seventh aspect, in a possible implementation of the seventh aspect, the control circuit further includes a first amplification unit. The first amplification unit is disposed between the sensor and the detection unit, and is configured to amplify the vibration sensing signal $S_z$.

With reference to the seventh aspect, in a possible implementation of the seventh aspect, the control circuit further includes a filter unit. The filter unit is disposed between the sensor and the detection unit, and the filter unit is configured to perform filtering processing on the vibration sensing signal $S_z$.

With reference to the seventh aspect, in a possible implementation of the seventh aspect, the sensor further includes a force sensing unit. The force sensing unit is configured to detect a force or a deformation of the outer housing, and output a force sensing signal $S_f$. The driving unit, the vibration sensing unit, and the force sensing unit are one device. The control circuit further includes a calculation unit. The calculation unit is configured to detect the force sensing signal $S_f$ and determine whether the force sensing signal $S_f$ meets an active starting condition, and transmit an indication signal to the signal generation unit when the force sensing signal $S_f$ meets the active starting condition. The indication signal is used to indicate to turn on the signal generation unit. The signal generation unit is configured to: after receiving the indication signal, alternately output the drive signal $S_d$ and the high-impedance state in time domain, or alternately output the drive signal $S_d$ and the floating state in time domain.

With reference to the seventh aspect, in a possible implementation of the seventh aspect, the control circuit further includes a second amplification unit. The second amplification unit is disposed between the sensor and the calculation unit, and is configured to amplify the force sensing signal $S_f$.

With reference to the seventh aspect, in a possible implementation of the seventh aspect, the calculation unit is specifically configured to: determine whether the force sensing signal $S_f$ meets a calculation starting condition, and when the force sensing signal $S_f$ meets the calculation starting condition, calculate, based on the force sensing signal $S_f$, a force and/or an accelerating force sensed by the sensor; and determine whether the force and/or the accelerating force meet/meets the active starting condition, and transmit the indication signal to the signal generation unit when the force and/or the accelerating force are/is greater than the active starting threshold.

With reference to the seventh aspect, in a possible implementation of the seventh aspect, the control circuit further includes an interrupt unit. The interrupt unit is configured to detect the force sensing signal $S_f$. When the force sensing signal $S_f$ meets a calculation starting condition, the interrupt unit turns on the calculation unit. The calculation unit is configured to: calculate, based on the force sensing signal $S_f$, a force and/or an accelerating force sensed by the sensor; and determine whether the force and/or the accelerating force meet/meets the active starting condition, and transmit the indication signal to the signal generation unit when the force and/or the accelerating force meet/meets the active starting condition.

With reference to the seventh aspect, in a possible implementation of the seventh aspect, the control circuit further includes a third amplification unit. The third amplification unit is disposed between the interrupt unit and the sensor, and is configured to amplify the force sensing signal $S_f$.

With reference to the seventh aspect, in a possible implementation of the seventh aspect, the sensor includes a first port and a second port. The first port is configured to receive the drive signal $S_d$ or output the vibration sensing signal $S_z$. The second port is configured to connect to ground or connect to a reference voltage.

With reference to the seventh aspect, in a possible implementation of the seventh aspect, the sensor includes an electrical or magnetic deformation-reversible device.

With reference to the seventh aspect, in a possible implementation of the seventh aspect, the sensor is a piezoelectric device.

With reference to the seventh aspect, in any possible implementation of the seventh aspect, the control circuit is a processing chip of the control circuit.

With reference to the seventh aspect, in any possible implementation of the seventh aspect, the control circuit is a control chip of the sensor.

According to an eighth aspect, a control circuit is provided, including: a signal generation unit, configured to output a drive signal $S_d$ to a sensor in a first time interval, and output a high-impedance state or a floating state in a second time interval, where the drive signal $S_d$ is used to drive the sensor to vibrate; and a detection unit, configured to detect, in the second time interval, a vibration sensing signal $S_z$ output by the sensor, and determine, based on the vibration sensing signal $S_z$, whether to trigger an event. The vibration sensing signal $S_z$ is a vibration coda wave response signal output by the sensor after the sensor receives the drive signal $S_d$.

With reference to the eighth aspect, in a possible implementation of the eighth aspect, the signal generation unit is specifically configured to alternately output the drive signal $S_d$ and the high-impedance state in time domain, or alternately output the drive signal $S_d$ and the floating state in time domain.

With reference to the eighth aspect, in a possible implementation of the eighth aspect, the control circuit further includes a first amplification unit. The first amplification unit is disposed between the sensor and the detection unit, and is configured to amplify the vibration sensing signal $S_z$.

With reference to the eighth aspect, in a possible implementation of the eighth aspect, the control circuit further includes a filter unit. The filter unit is disposed between the sensor and the detection unit, and the filter unit is configured to perform filtering processing on the vibration sensing signal $S_z$.

With reference to the eighth aspect, in a possible implementation of the eighth aspect, the control circuit further includes a calculation unit. The calculation unit is configured to receive a force sensing signal $S_f$ output by the sensor. The force sensing signal $S_f$ is used to indicate a force or a deformation detected by the sensor. The calculation unit is further configured to determine whether the force sensing signal $S_f$ meets an active starting condition, and transmit an indication signal to the signal generation unit when the force sensing signal $S_f$ meets the active starting condition. The indication signal is used to indicate to turn on the signal generation unit. The signal generation unit is configured to: after receiving the indication signal, alternately output the drive signal $S_d$ and the high-impedance state in time domain, or alternately output the drive signal $S_d$ and the floating state in time domain.

With reference to the eighth aspect, in a possible implementation of the eighth aspect, the control circuit further includes an interrupt unit. The interrupt unit is configured to detect the force sensing signal $S_f$ output by the sensor. The force sensing signal $S_f$ is used to indicate a force or a deformation detected by the sensor. When the force sensing signal $S_f$ meets a calculation starting condition, the interrupt unit turns on the calculation unit. The calculation unit is specifically configured to: calculate, based on the force sensing signal $S_f$, a force and/or an accelerating force sensed by the sensor; and determine whether the force and/or the accelerating force meet/meets the active starting condition, and transmit the indication signal to the signal generation unit when the force and/or the accelerating force meet/meets the active starting condition.

With reference to the eighth aspect, in a possible implementation of the eighth aspect, the control circuit further includes a third amplification unit. The third amplification unit is disposed between the interrupt unit and the sensor, and is configured to amplify the force sensing signal $S_f$.

With reference to the eighth aspect, in a possible implementation of the eighth aspect, the sensor includes a first port and a second port. The first port is configured to receive the drive signal $S_d$ or output the vibration sensing signal $S_z$. The second port is configured to connect to ground or connect to a reference voltage.

With reference to the eighth aspect, in a possible implementation of the eighth aspect, the sensor includes an electrical or magnetic deformation-reversible device.

With reference to the eighth aspect, in a possible implementation of the eighth aspect, the sensor is a piezoelectric device.

With reference to the eighth aspect, in any possible implementation of the eighth aspect, the control circuit is a processing chip of the control circuit.

With reference to the eighth aspect, in any possible implementation of the eighth aspect, the control circuit is a control chip of the sensor.

With reference to the eighth aspect, in any possible implementation of the eighth aspect, the control circuit and the sensor are disposed in an electronic device, and the outer housing is a part of a housing of the electronic device.

With reference to the eighth aspect, in any possible implementation of the eighth aspect, the outer housing is an outer housing of the sensor.

According to a ninth aspect, a touch key assembly is provided, including a sensor, an outer housing, and the control circuit according to any one of the eighth aspect or the implementations of the eighth aspect. The drive signal $S_d$ is used to drive a driving unit of the sensor to vibrate along with the outer housing.

According to a tenth aspect, an electronic device is provided, including the touch key assembly according to the ninth aspect. The outer housing is attached to or integrated with a housing of the electronic device.

According to an eleventh aspect, a chip is provided. The chip includes the control circuit according to any one of the eighth aspect or the implementations of the eighth aspect.

Figure 4:
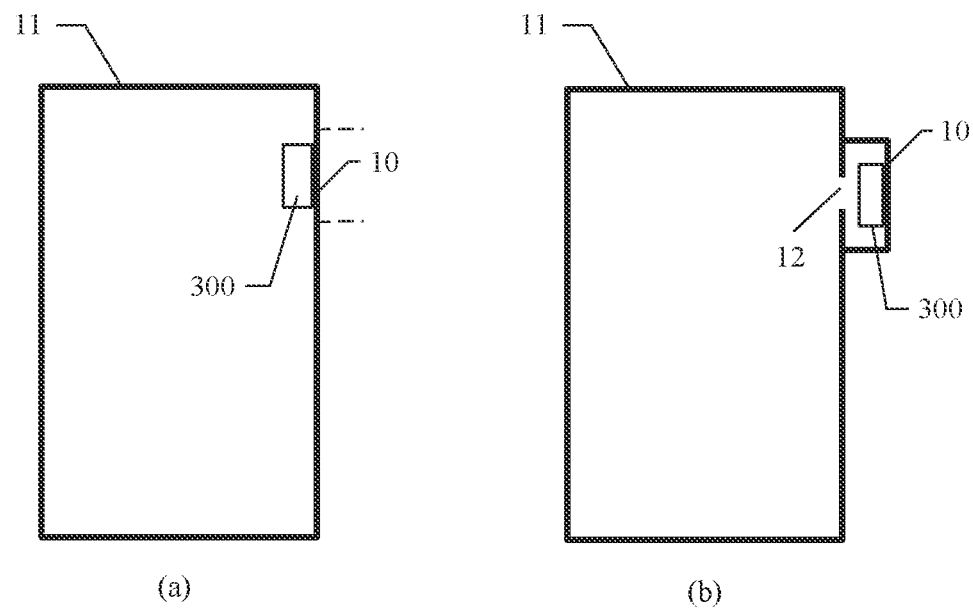
Figure 5:
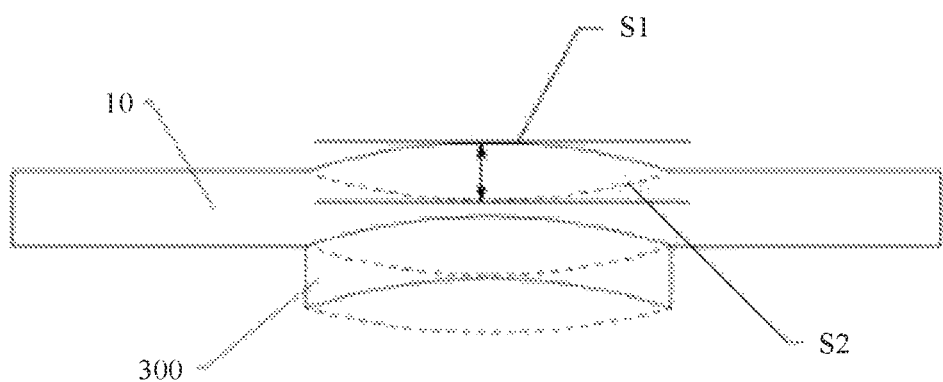
Figure 6:
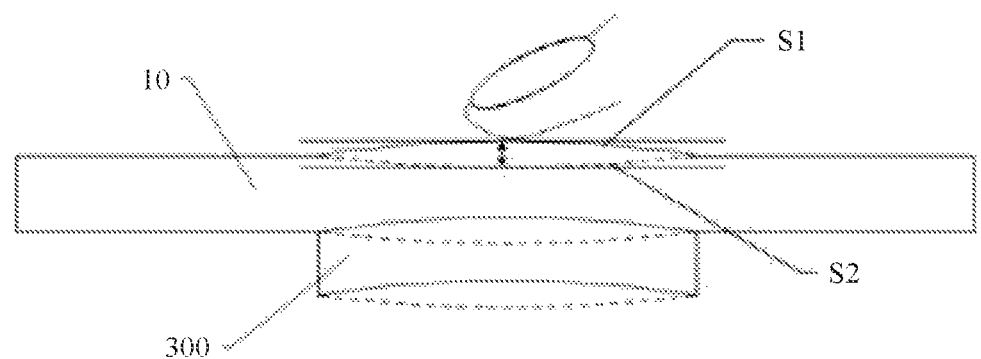
Figure 7:
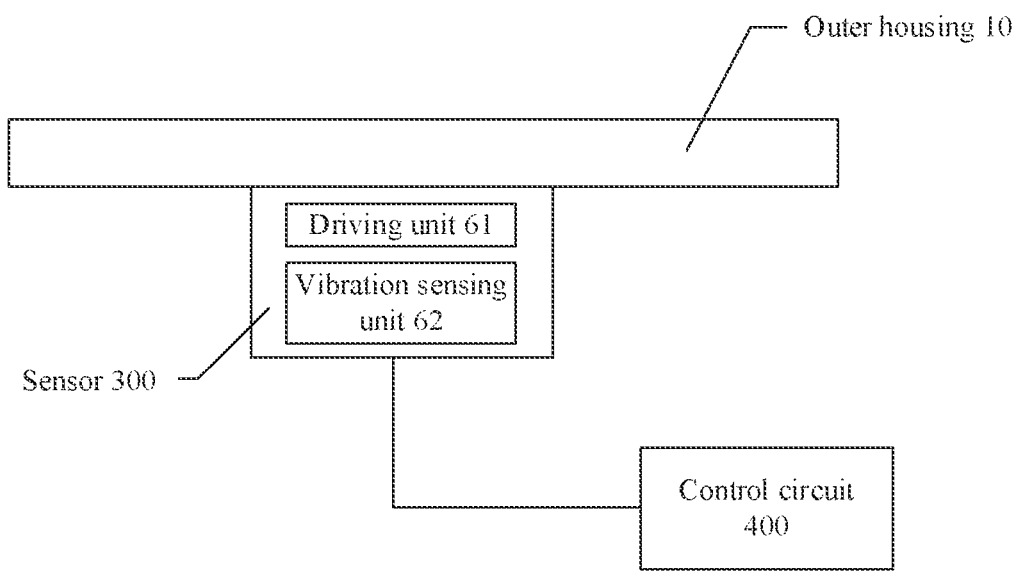
Figure 8:
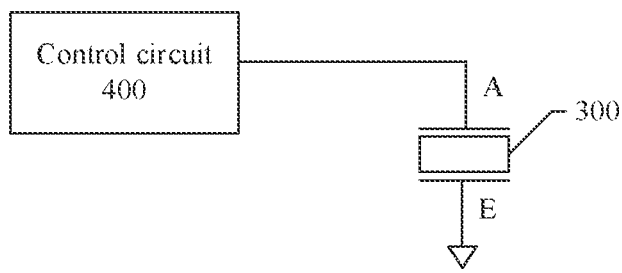
Figure 9:
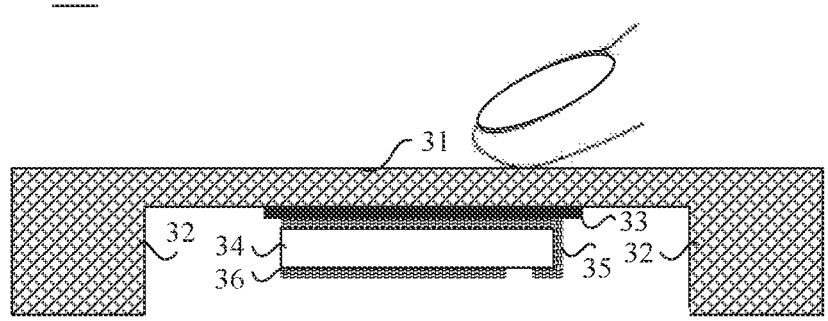
Figure 10:
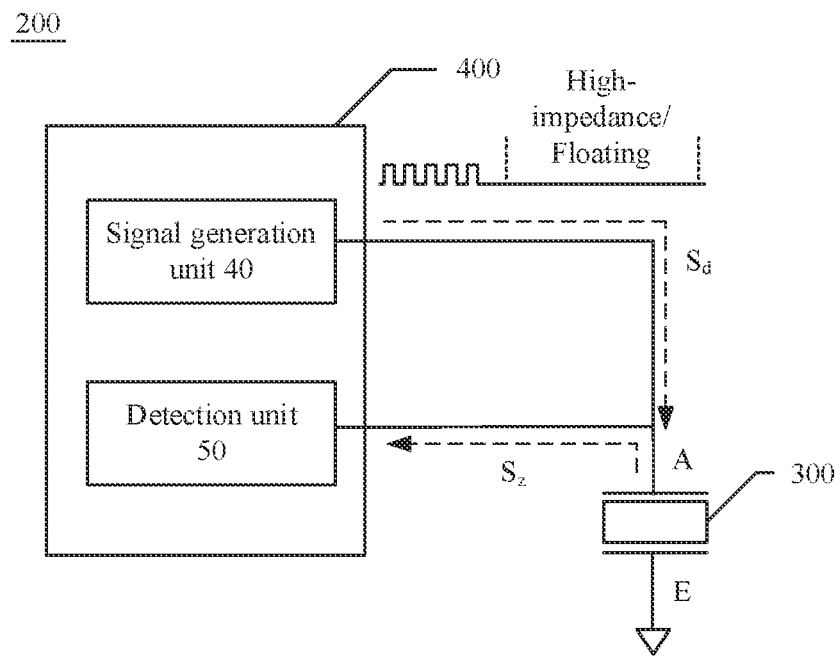
Figure 11:
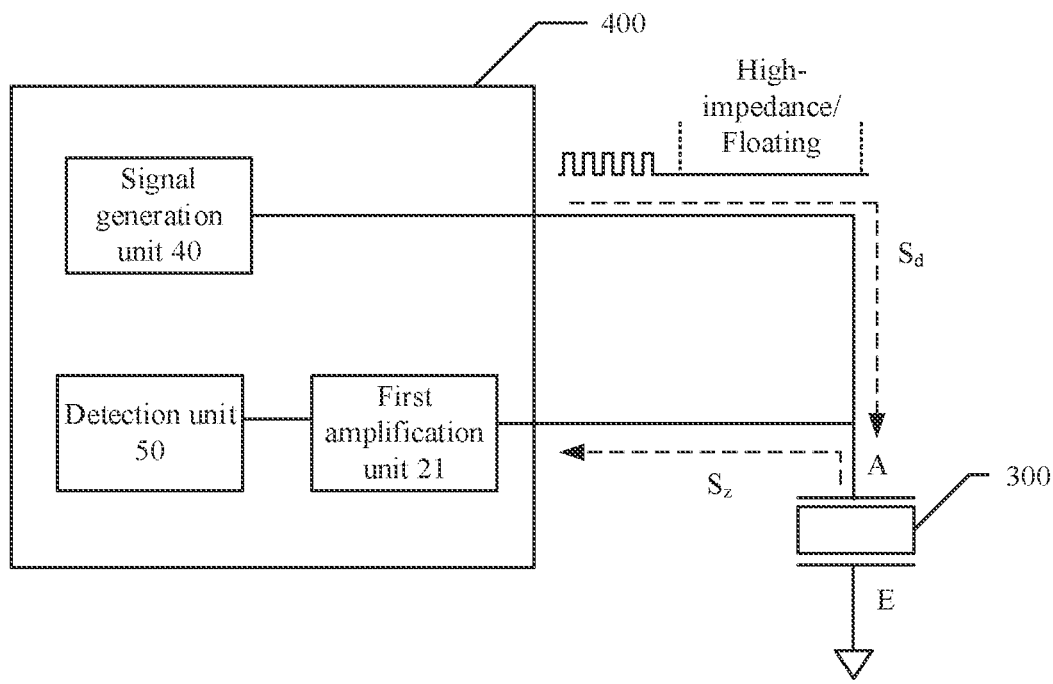
Figure 12:
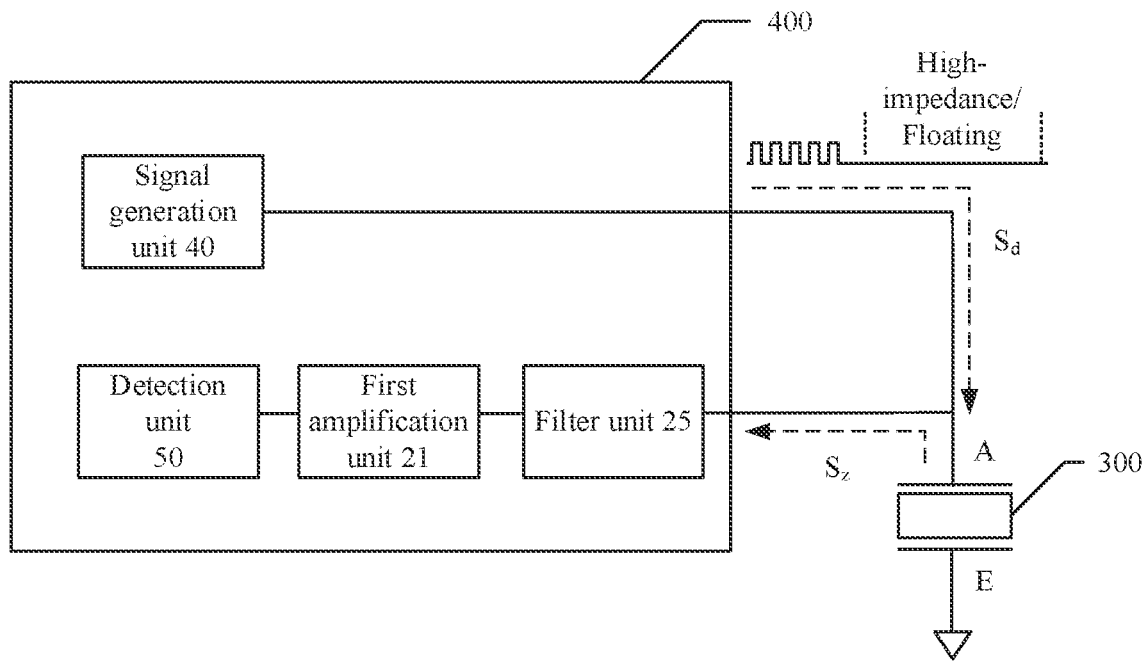
Figure 13:
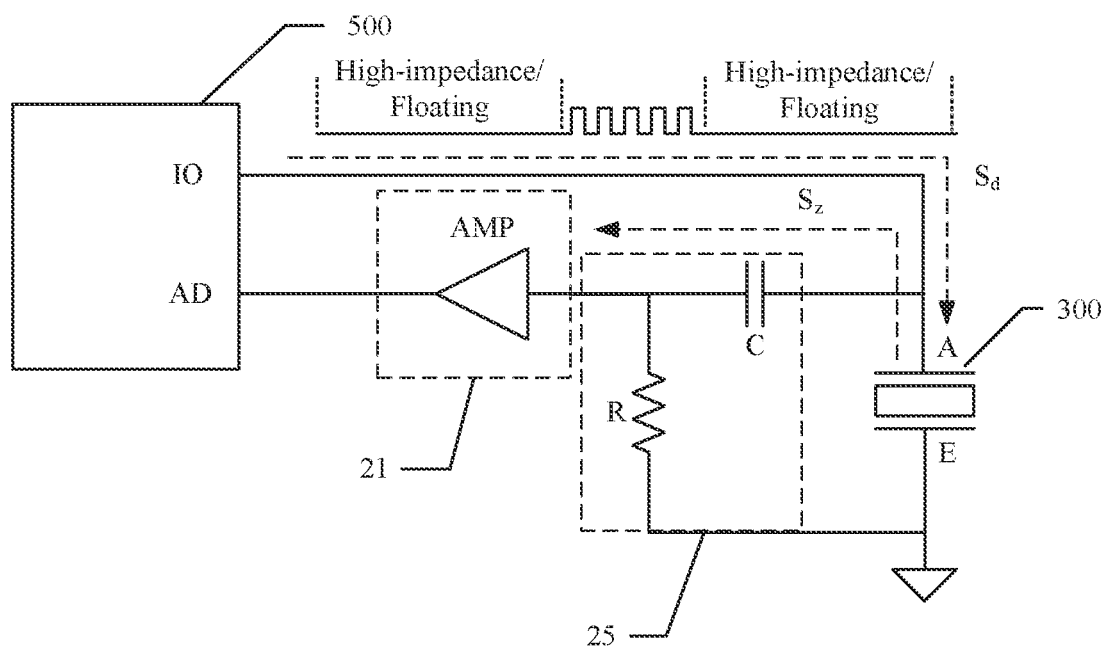
Figure 14:
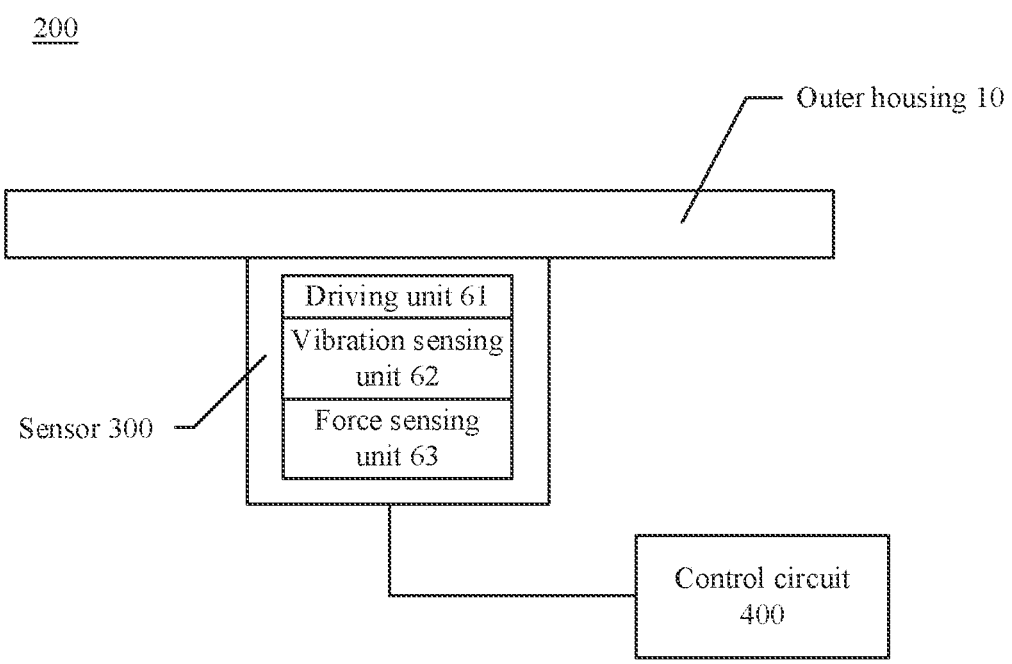
Figure 15:
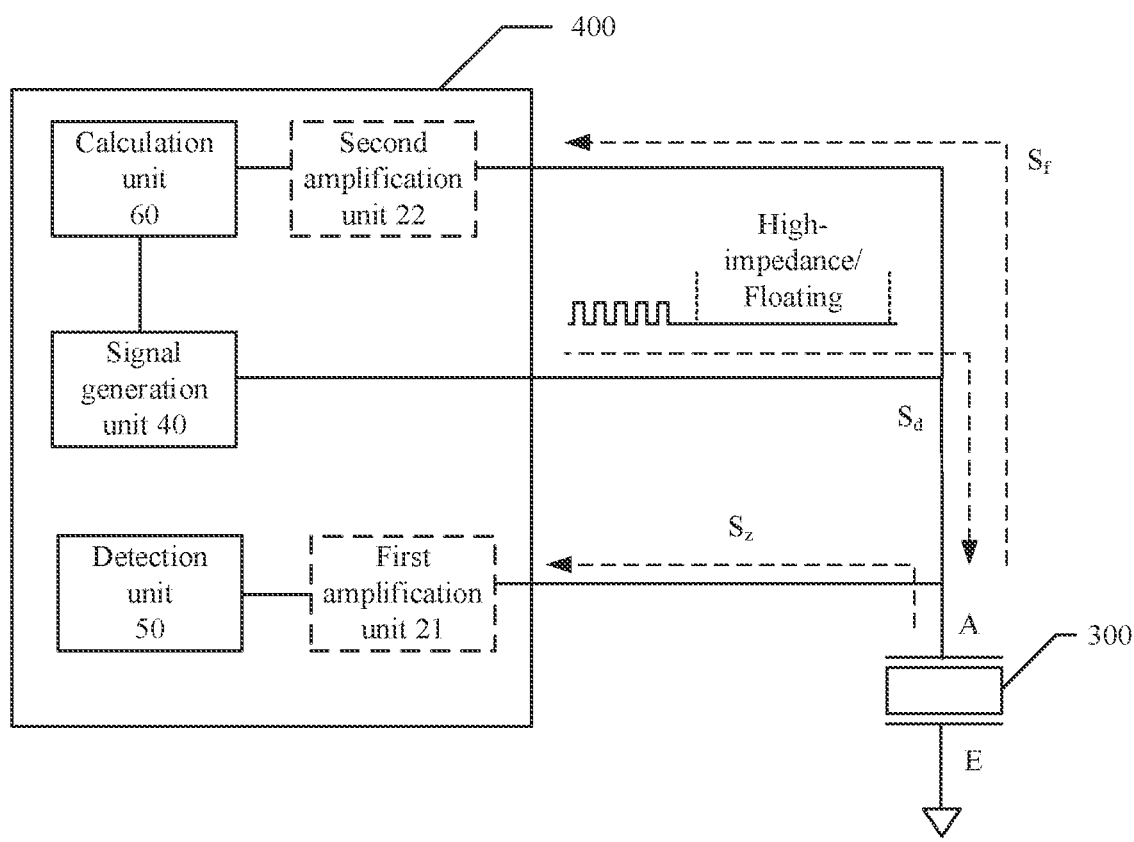
Figure 16:
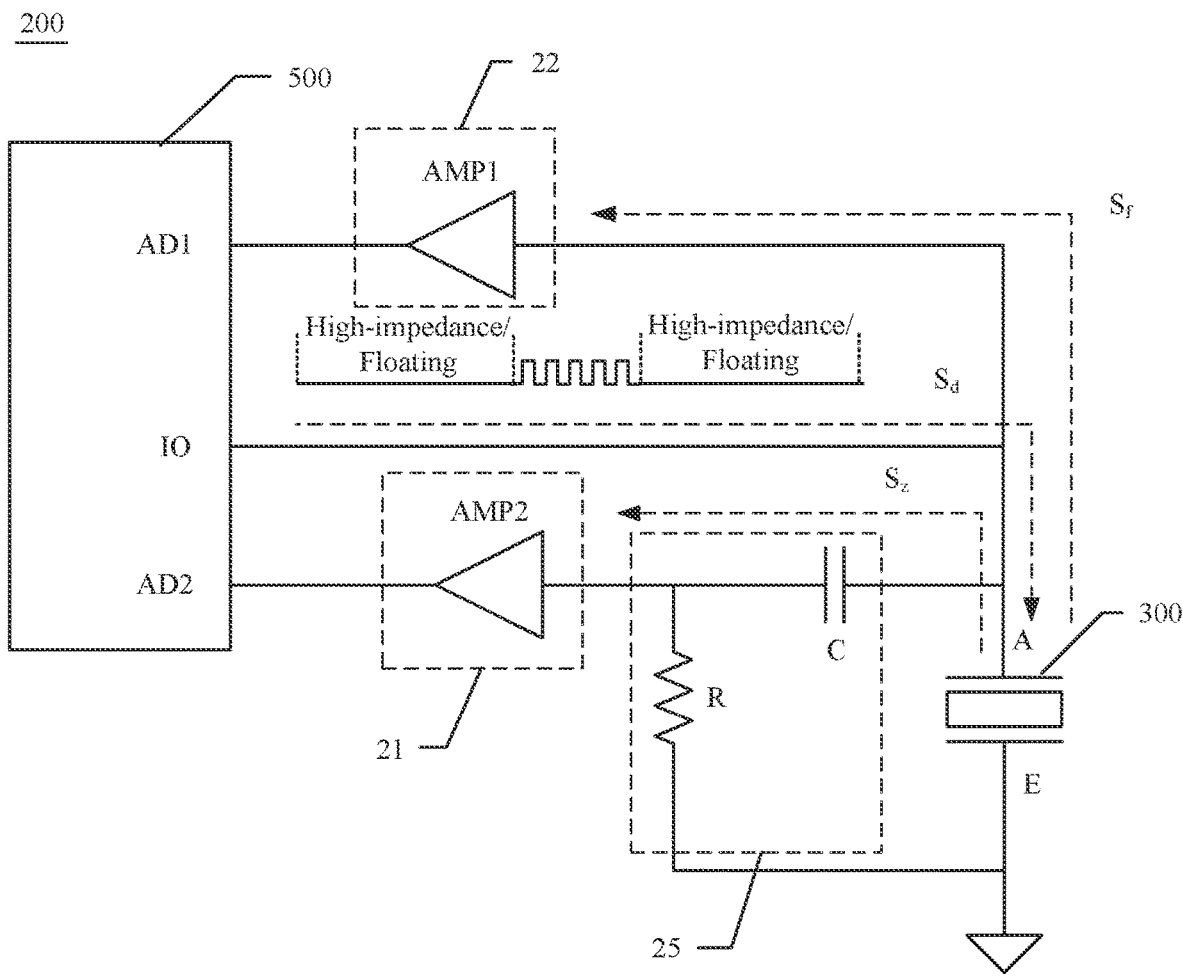
Figure 17:
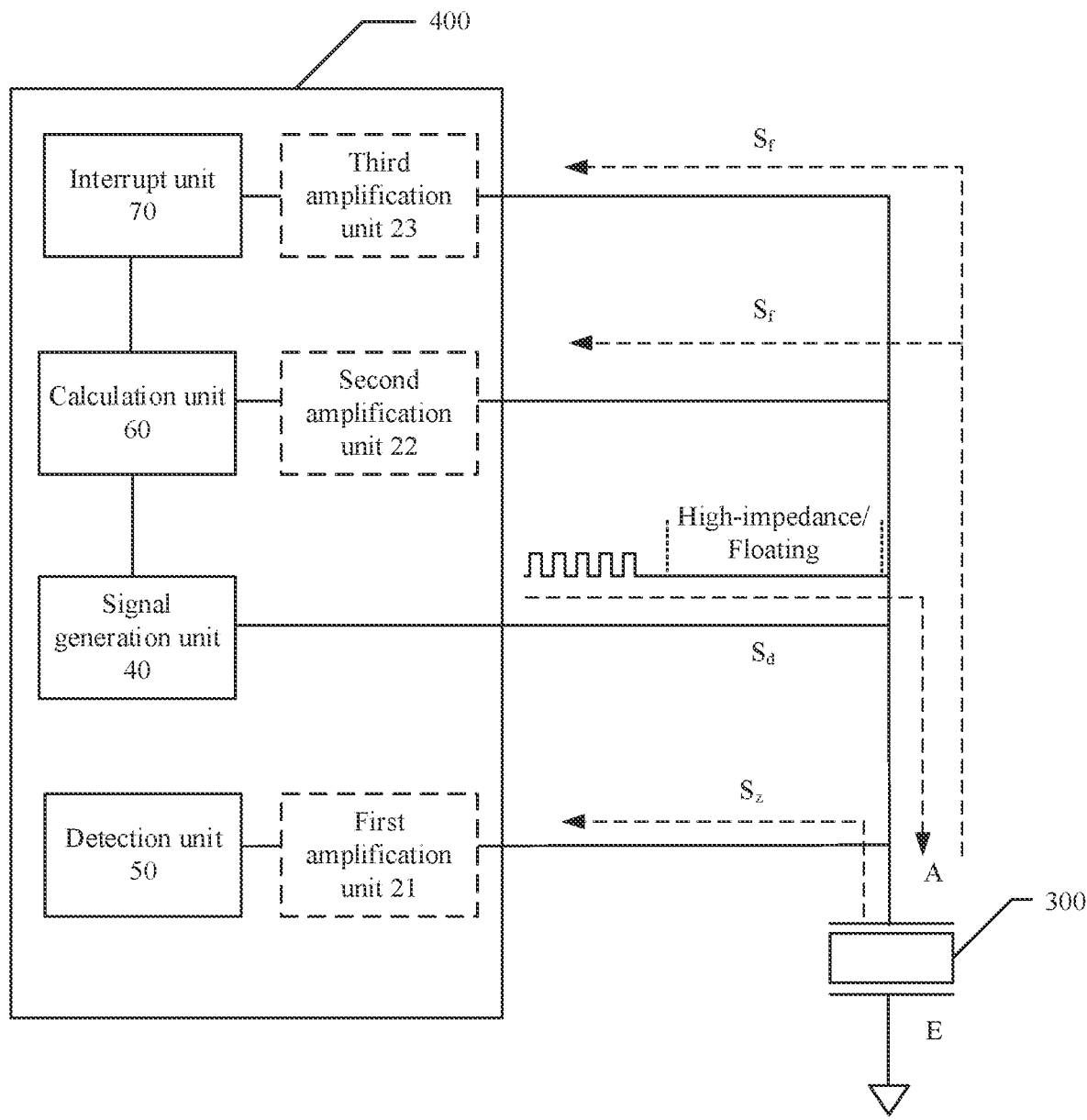
Figure 18:
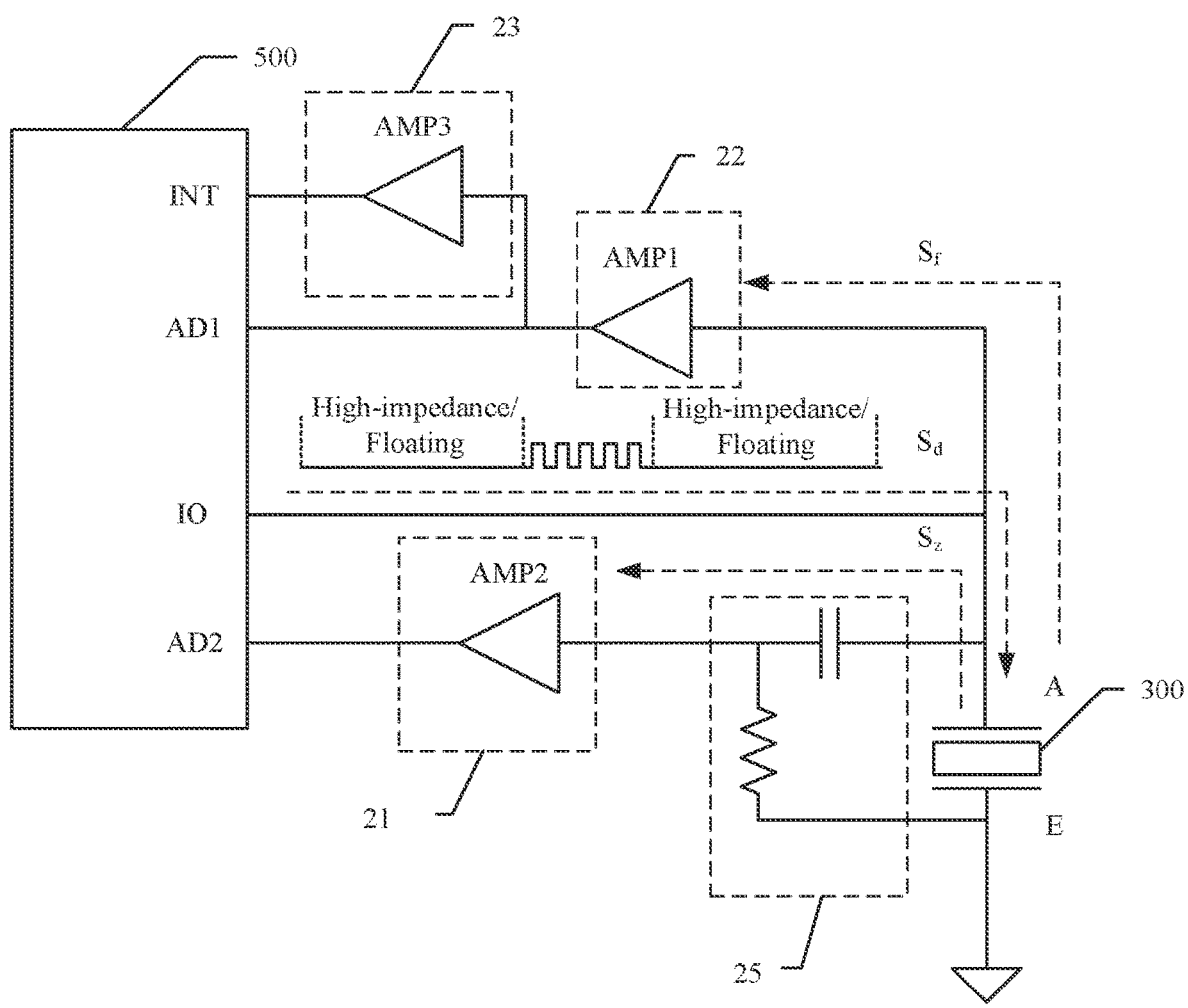

(a) and (b) in FIG. 4 are schematic structural diagrams of an electronic device and a sensor according to an embodiment of this application;

FIG. 5 is a schematic diagram of vibration of a touch key assembly not subject to a touch or press force according to an embodiment of this application;

FIG. 6 is a schematic diagram of vibration of a touch key assembly subject to a touch or press force according to an embodiment of this application;

FIG. 7 is a schematic structural diagram of a touch key assembly according to another embodiment of this application;

FIG. 8 is a schematic structural diagram of a touch key assembly according to another embodiment of this application;

FIG. 9 is a schematic structural diagram of a sensor according to an embodiment of this application;

FIG. 10 is a schematic structural diagram of a touch key assembly according to another embodiment of this application;

FIG. 11 is a schematic structural diagram of a touch key assembly according to another embodiment of this application;

FIG. 12 is a schematic structural diagram of a touch key assembly according to another embodiment of this application;

FIG. 13 is a schematic circuit diagram of a touch key assembly according to an embodiment of this application;

FIG. 14 is a schematic structural diagram of a touch key assembly according to another embodiment of this application;

FIG. 15 is a schematic structural diagram of a touch key assembly according to another embodiment of this application;

FIG. 16 is a schematic circuit diagram of a touch key assembly according to another embodiment of this application;

FIG. 17 is a schematic structural diagram of a touch key assembly according to another embodiment of this application; and FIG. 18 is a schematic circuit diagram of a touch key assembly according to another embodiment of this application.

DESCRIPTION OF EMBODIMENTS

The following describes technical solutions of this application with reference to accompanying drawings.

Embodiments of this application relate to a touch key assembly and an apparatus that may be applied to an electronic device. The electronic device may be a terminal device. The terminal device may include a mobile terminal (such as a smartphone or a tablet computer), a wearable electronic device (such as a smartwatch), a household appliance, an automobile dashboard, or another electrical product.

Application of the touch key assembly is of great significance for improving user experience and waterproofing. However, the touch key assembly is very likely to be accidentally triggered. The accidental triggering leads to relatively poor user experience, thereby limiting development of a touch key assembly technology in an electronic device such as a smartphone or a tablet computer. In addition, good force sensing enables a user to have good experience with a triggering response. How to design a cost-effective and reliable touch key assembly to respond well to a force from a user and reduce accidental triggering is a current development direction of a touch key assembly.

Figure 1:
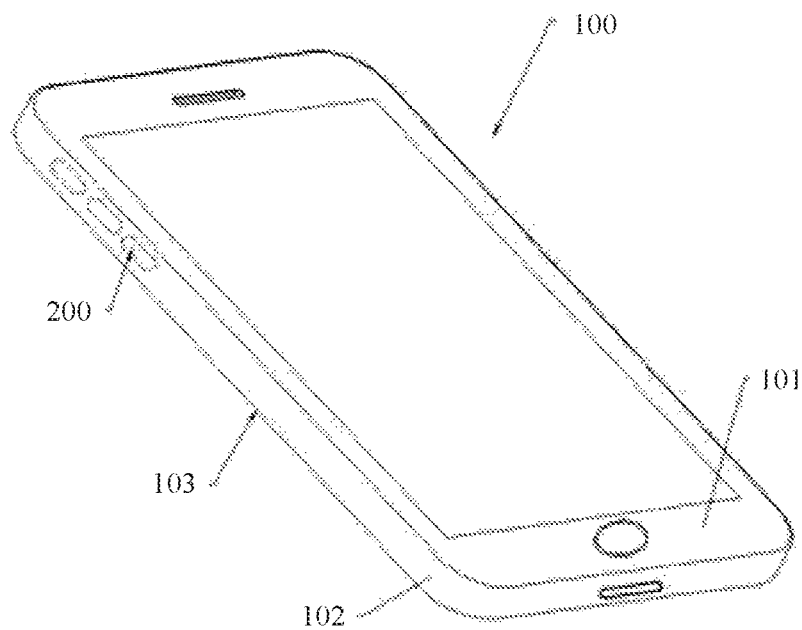
FIG. 1 is a schematic structural diagram of an electronic device to which an embodiment of this application may be applied.

FIG. 1 is a schematic structural diagram of an electronic device 100 to which an embodiment of this application may be applied. As shown in FIG. 1, a housing of the electronic device 100 includes a front panel 101, a middle frame 102, and a rear cover 103. Usually, a touch key assembly may be disposed at a location of the housing or a touchscreen of the electronic device 100, for example, a location of the front panel 101, the middle frame 102, or the rear cover 103. The touch key assembly may be disposed on an outer side wall or an inner side wall of the housing of the electronic device 100. The touch key assembly in FIG. 1 is disposed at an outer bezel of the middle frame 102, and is indicated by a dashed-line box. In actual application, a mark symbol may be provided on an outer surface of the electronic device 100, to indicate a location at which a user is to trigger the touch key assembly. Alternatively, a transparent region, a light transmission region, a convex part, or a concave part may be provided on the housing of the electronic device 100, and the touch key assembly is disposed therein. Alternatively, the touch key assembly may be made into a module form and attached to the housing of the electronic device 100. The touch key assembly in this application may implement a function of a general-purpose physical key (in other words, a mechanical key), for example, a functional key such as a volume adjustment key, a confirmation key, a power key, a sliding key, or a press key.

Figure 2:
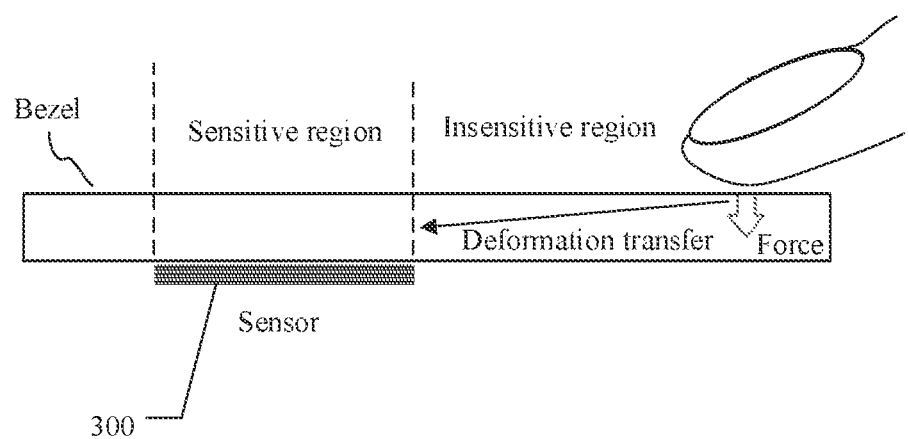
FIG. 2 is a schematic diagram of accidentally triggering a touch key assembly by a user according to an embodiment of this application.

FIG. 2 is a schematic diagram of accidentally triggering a touch key assembly by a user according to an embodiment of this application. FIG. 2 shows only a sensor 300 of the touch key assembly, and does not show a control circuit of the touch key assembly. As shown in FIG. 2, an outer surface of an electronic device includes a sensitive region and an insensitive region, and the sensor 300 of the touch key assembly may be disposed at an inner-wall location corresponding to the sensitive region. The insensitive region is a region adjacent to the sensitive region. In an ideal case, the sensor 300 of the electronic device detects a deformation only when a user touches the sensitive region, and further indicates that the touch key assembly is triggered by the user. When the user touches a region beyond the sensitive region, the sensor 300 of the electronic device detects no deformation, and therefore does not indicate that the touch key assembly is triggered by the user. Therefore, the electronic device makes no misjudgment. However, in actual application, the touch key assembly is very likely to be accidentally triggered. For example, the touch key assembly is accidentally triggered by an object other than a human body, or the key is accidentally triggered when the user gets in contact with the insensitive region. Some causes of the accidental triggering are as follows: Most sensors measure only deformations, that is, perform force or deformation sensing. A deformation in the insensitive region is likely to be transferred to the sensitive region, thereby causing a deformation in the sensitive region. When detecting the deformation, the sensor determines that the sensitive region is touched, thereby causing accidental triggering. A deformation caused by a vibration feedback (for example, a motor vibration in the device) may also cause accidental triggering by the sensor.

To eliminate impact of the accidental triggering, an approach is to resist the accidental triggering by changing a structure, for example, by increasing a side thickness, so that deformations beyond the insensitive region are reduced, and deformations transferred to the sensitive region are also reduced. However, this approach is contradictory to a development trend of thinning a mobile device, and is likely to cause relatively poor user experience due to inconsistent touch forces. Another approach is to make the sensitive region have some feature recognition codes, for example, fingerprint recognition. However, this approach results in relatively high costs, and adding a fingerprint recognition function slows down a key response, thereby affecting user experience. Therefore, how to manufacture a virtual key with good accidental triggering prevention is a hot research topic in the industry.

Figure 3:
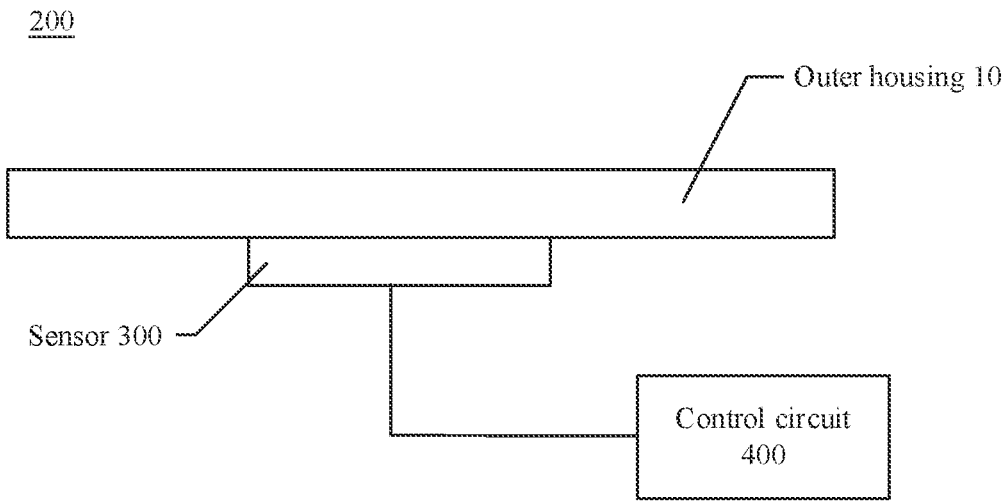
FIG. 3 is a schematic structural diagram of a touch key assembly according to an embodiment of this application.

FIG. 3 is a schematic structural diagram of a touch key assembly according to an embodiment of this application. As shown in FIG. 3, the touch key assembly includes a sensor 300 and a control circuit 400, and the sensor 300 is attached to an outer housing 10. Optionally, the outer housing 10 may be a part of a housing of an electronic device. In other words, the outer housing 10 and the housing of the electronic device are an integrated structure. For example, as shown in (a) in FIG. 4, the sensor 300 may be attached to an inner surface of the housing 11 of the electronic device. Alternatively, the outer housing 10 and the housing 11 of the electronic device may be separate structures. For example, the outer housing 10 may be an outer housing of the sensor 300. In this case, the sensor 300 may be attached to an outer surface of the housing 11 of the electronic device, and the outer housing 10 touched by a user is the outer housing of the sensor 300, but not the housing of the electronic device. For example, as shown in (b) in FIG. 4, a via 12 may be provided on the housing 11 of the electronic device, and the sensor 300 is attached to the outer surface of the housing 11 of the electronic device. If the control circuit 400 is disposed inside the electronic device, the sensor 300 may be connected to the control circuit 400 through the via 12. If both the control circuit 400 and the sensor 300 are packaged in the outer housing 10, the control circuit 400 may be connected to a processing chip inside the electronic device through the via 12. For another example, a concave part may be provided on the outer surface of the housing 11 of the electronic device, and the sensor 300 is disposed in the concave part, so that a surface height of the sensor 300 is the same as that of the housing of the electronic device. A person skilled in the art can understand that there may be alternatively other implementations of a location relationship between the touch key assembly and the electronic device, and the implementations are not described one by one in this application.

The sensor 300 is configured to sense a touch or press force applied by the user or another object to the outer housing 10, and generate a corresponding sensing signal. The control circuit 400 detects the sensing signal transmitted by the sensor 300. The control circuit 400 may determine, based on the sensing signal, whether to trigger an event. The triggering an event may be triggering a function corresponding to the touch key assembly. For example, if the touch key assembly corresponds to a power key, a power-on function is triggered. If the touch key assembly corresponds to volume adjustment, a volume adjustment function is triggered. Optionally, the touch key assembly may also be referred to as a touch sensing module, a virtual key, or the like.

In an implementation, the touch key assembly may be implemented by using a high-frequency vibration damping suppression method. The method is also referred to as an active method. A principle of the active method is as follows: The control circuit 400 outputs a drive signal $S_d$ at a specific frequency to the sensor 300, and the drive signal $S_d$ enables the sensor 300 to vibrate along with the outer housing 10. A structure obtained by combining the sensor 300 and the outer housing 10 may be referred to as a composite resonator. The frequency of the drive signal $S_d$ may be the same as or close to a resonance frequency of the composite resonator. The control circuit 400 detects a vibration sensing signal $S_z$ that is output by the sensor 300 in response to the vibration. If the user touches or presses a region in which the touch key assembly is located, an amplitude of the vibration sensing signal $S_z$ output by the sensor 300 is attenuated or increased. The control circuit 400 may determine an attenuation or increase degree of the vibration sensing signal $S_z$, to determine whether to trigger an event. This determining manner is determining based on two values: 0 and 1. This manner can effectively resist non-human accidental triggering, and has advantages of low costs and high sensitivity.

Optionally, when the drive signal $S_d$ is input, the vibration sensing signal $S_z$ detected by the control circuit 400 may be a response signal output by the sensor 300 when the sensor 300 is receiving the drive signal $S_d$, or may be a coda wave response output by the sensor 300 after the sensor 300 receives the drive signal $S_d$. This is not limited in this application. The control circuit 400 may determine, based on whether the vibration sensing signal $S_z$ conforms to a human triggering characteristic, whether to trigger an event. If the vibration sensing signal $S_z$ conforms to the human triggering characteristic, the control circuit 400 determines to trigger an event. If the vibration sensing signal $S_z$ does not conform to the human triggering characteristic, the control circuit 400 discards the current detection. The following describes a specific manner of determining whether the vibration sensing signal $S_z$ conforms to the human triggering characteristic.

Still referring to FIG. 3, the control circuit 400 is configured to compare the vibration sensing signal $S_z$ with a threshold, obtain a comparison result, and determine, based on the comparison result, whether to trigger an event. The threshold is a boundary value of a range conforming to a user touch habit. When the comparison result shows that the vibration sensing signal $S_z$ falls within the range conforming to the user touch habit, the control circuit 400 determines to trigger an event. The "boundary value" may be an upper limit or a lower limit of the range conforming to the user touch habit. A reason is as follows: When the user presses the touch key, a touch or press force of the user may cause a decrease in an amplitude of the outer housing 10 or an increase in an amplitude of the outer housing 10. In other words, the touch or press force of the user may suppress vibration of the outer housing 10, or increase a vibration amplitude of the outer housing 10. When the touch or press force of the user suppresses the vibration of the outer housing 10, the threshold is the upper limit of the range conforming to the user touch habit. When the touch or press force of the user increases the vibration amplitude of the outer housing 10, the threshold is the lower limit of the range conforming to the user touch habit.

The vibration sensing signal $S_z$ is used to indicate the vibration amplitude of the outer housing 10. The vibration sensing signal $S_z$ may be a voltage signal, a current signal, or a resistance variation. This is related to a specific design form of the sensor 300. Correspondingly, the range conforming to the user touch habit is an amplitude range obtained by applying, to a vibration region of the outer housing 10, a habitual force used by the user to trigger the touch key. The conforming to the user touch habit means satisfying a user touch feeling. The range conforming to the user touch habit is a range value obtained by collecting and sampling data based on habits of different user touch feelings, and performing statistical analysis. For example, a user touch habit range may be collected and obtained through machine learning, and user touch habit ranges of different users may be different.

In an implementation, when the outer housing 10 is not subject to a touch or press force, an amplitude of vibration produced by the outer housing 10 driven by the sensor 300 falls within a first range. As shown in FIG. 3, when the sensor 300 is not operating, the outer housing 10 does not vibrate either. FIG. 5 is a schematic diagram of vibration of the outer housing 10 driven by the sensor 300 when the outer housing 10 is not subject to a touch or press force. The schematic diagram includes two states with maximum shifts during the vibration. The two states are indicated by a solid line (S1) and a dashed line (S2). When an outer surface of the outer housing 10 is subject to a touch or press force, as shown in FIG. 6, a finger of the user touches the outer housing 10, under an effect of the touch or press force, vibration of the outer housing 10 is suppressed, and an amplitude of the vibration of the outer housing 10 in the state shown in FIG. 6 is less than that of the vibration of the outer housing 10 shown in FIG. 5. Certainly, at specific vibration frequency, the amplitude of the outer housing 10 becomes larger. In other words, with the touch key assembly of this application, the effect of the touch or press force on the outer housing 10 may also increase the amplitude of the outer housing 10.

The control circuit receives the vibration sensing signal $S_z$, and determines, based on the comparison result of the vibration sensing signal $S_z$ and the threshold, whether to trigger an event. When the touch or press force applied to the outer housing 10 suppresses the vibration of the outer housing 10, the threshold is less than a lower limit of the first range, and when the amplitude of the vibration sensing signal $S_z$ is less than the threshold, the control circuit 400 determines to trigger an event. When the touch or press force applied to the outer housing 10 intensifies the vibration of the outer housing 10, the threshold is greater than an upper limit of the first range, and when the amplitude of the vibration sensing signal $S_z$ is greater than the threshold, the control circuit 400 determines to trigger an event. Data of the first range is affected by factors such as a temperature and a material of the electronic device on which touching or pressing is performed. The first range is a vibration amplitude obtained through statistics after a plurality of tests when the outer housing is not subject to a touch or press force by the user (or a fixed touch or press force). The first range may be a voltage signal or a resistance variation. The first range may be set by a circuit integrated in a main chip or a processor of the electronic device, or may be set by a hardware circuit independent of the main chip or the processor.

This application provides a touch key assembly. The sensor 300 vibrates along with the outer housing 10, and detects the vibration amplitude of the outer housing 10. When a touch or press force is applied, the vibration of the outer housing 10 is suppressed, or the vibration of the outer housing 10 is intensified. The control circuit 400 obtains, through comparison, a relationship between the detected amplitude and the threshold, to implement a virtual key.

The first range may be an amplitude range of vibration of the outer housing 10 driven by the sensor 300 when the outer housing 10 is subject to a fixed touch or press force (including that the fixed touch or press force is zero, that is, no touch or press force is applied). When the outer housing 10 is subject to a fixed touch or press force without interference from any environmental factor, an amplitude of vibration of the outer housing 10 driven by the sensor 300 should be a numerical value. However, the electronic device is inevitably affected by some environmental factors such as a temperature change, different materials of the outer housing 10, or a user status change (for example, the vibration amplitude of the outer housing 10 is affected by factors such as the electronic device being located in the user's pocket, the user being m a static state or a moving state, or a contact or friction change between the electronic device and the user). Due to impact of these environmental factors, an amplitude range of vibration of the outer housing 10 driven by the sensor 300 when the outer housing 10 is subject to a fixed touch or press force is defined as the first range. The first range is set to a vibration amplitude obtained through statistics after a plurality of tests when the outer housing is subject to a fixed touch or press force, and may be a voltage signal, a current signal, or a resistance variation.

Based on user experience or experimental data, it is learned that a relatively appropriate condition under which the control circuit triggers an event is that the threshold is less than the lower limit of the first range or greater than the upper limit of the first range, so that accurate determining can be performed, and triggering accuracy and reliability of the touch key are improved. In an implementation, the threshold is 0.1 to 0.9 times the lower limit of the first range, or the threshold is greater than or equal to 1.1 times the upper limit of the first range.

Optionally, in this application, a buffer structure is disposed on an inner surface of the outer housing 10, so that vibration produced by the sensor 300 is concentrated in a region, of the outer housing, that is attached to the sensor 300, and the vibration is prevented from spreading to another region of the outer housing 10. In this way, sensitivity of the touch key assembly can be ensured. When a touch or press force is applied to a vibration location of the outer housing, accidental triggering of the another region of the outer housing 10 can be prevented from affecting the touch key assembly. Because the another region of the outer housing 10 is not affected by the vibration of the sensor, when a touch or press force is applied to the another region of the outer housing 10, an amplitude of vibration of the outer housing along with the sensor is not suppressed or increased, so that the touch key assembly is not triggered.

FIG. 7 is a schematic structural diagram of a touch key assembly according to another embodiment of this application. As shown in FIG. 7, in this solution, a sensor 300 usually needs to include a driving unit 61 and a vibration sensing unit 62. The driving unit 61 is configured to receive a drive signal $S_d$ input by a control circuit 400, and drive an outer housing 10 to vibrate. The vibration sensing unit 62 is configured to generate a vibration sensing signal S in response to the vibration. The driving unit 61 may be any one of the following types: a piezoelectric device, a magnetomechanical device, an electromechanical device, and a thermoelectric device. The vibration sensing unit 62 may be any one of the following devices; a piezoelectric device, a piezoresistive device, a piezocapacitive device, and a piezoinductive device.

Usually, the sensor 300 in the foregoing solution requires at least two devices to implement the driving unit and the vibration sensing unit. For example, both the driving unit 61 and the vibration sensing unit 62 may be piezoelectric devices; or the driving unit 61 may be a piezoelectric device, and the vibration sensing unit 62 may be a piezoresistive device. The driving unit 61 is connected to a port of the sensor 300, and is configured to receive the drive signal $S_d$. The vibration sensing unit 62 is connected to another port of the sensor 300, and is configured to output the vibration sensing signal $S_z$. In other words, the sensor 300 needs to include at least two units. In addition to a common end used to connect to ground or connect to a reference voltage, the sensor further includes two or more ports. A structure is relatively complex, and many requirements are posed for manufacturing the sensor. This is relatively difficult for some small-sized application scenarios, and a manufacturing manner is also relatively complex.

Therefore, based on the active method, this embodiment of this application provides a touch key assembly. In this solution, a "unit function time division multiplexing technology" is used to implement the touch key assembly. To be specific, one unit (in other words, one device) of the sensor performs different functions in different time periods, to implement multi-functionalization of a single unit. For example, one device separately implements a function of the driving unit and a function of the vibration sensing unit in different time periods, and unit function time division multiplexing may be implemented by using a single-output sensor, thereby simplifying a circuit and reducing costs.

FIG. 8 is a schematic structural diagram of a touch key assembly 200 according to another embodiment of this application. As shown in FIG. 8, the touch key assembly 200 includes a sensor 300 and a control circuit 400. The sensor 300 may be implemented by using a single unit. In other words, the sensor 300 is a single-output sensor. The sensor 300 includes two ports: a first port A and a second port E. The second port E is configured to connect to ground or connect to a reference voltage. The first port A may be configured to receive a drive signal $S_d$, and may also be configured to output a vibration sensing signal $S_z$. The control circuit is configured to output the drive signal $S_d$ to the sensor 300, and receive the vibration sensing signal $S_z$ output by the sensor.

The drive signal $S_d$ is intermittently transmitted. To be specific, the drive signal $S_d$ and a high-impedance state (or a floating state) are alternately output in time domain. The drive signal $S_d$ and the high-impedance state (or the floating state) may be periodically or aperiodically alternated in time domain. For example, a drive signal $S_d$ with a length of 5 ms is output after every 10-ms high-impedance state (or floating state). The first port A is configured to receive the drive signal $S_d$, and after receiving the drive signal $S_d$, output the vibration sensing signal $S_z$ in response to the drive signal $S_d$, to implement time division multiplexing of the sensor 300 on the first port A. The vibration sensing signal $S_z$ is a vibration coda wave response signal output after the drive signal $S_d$ is received, but not a response signal output when the drive signal $S_d$ is being received. Therefore, the drive signal $S_d$ is designed to be an intermittently transmitted signal, and the control circuit 400 detects the coda wave response signal for the drive signal $S_d$ in an interval period after the drive signal $S_d$ is transmitted, so that time division multiplexing can be performed on one port of the sensor 300 to implement driving and detection. This solution can reduce complexity of a module of the touch key assembly, and meet requirements of low costs, high sensitivity, and accidental triggering prevention.

In this embodiment of this application, the vibration coda wave response signal may also be referred to as a coda wave response signal or a coda wave response. In a time period after the sensor receives a segment of drive signal $S_d$, although the sensor does not receive a drive signal $S_d$, vibration of the sensor caused by the drive signal $S_d$ has not stopped. In this case, the vibration may be referred to as a vibration coda wave, and a signal generated by detecting the vibration coda wave by the sensor may be referred to as a vibration coda wave response signal.

The high-impedance state means that a node in a circuit has a higher impedance than another node in the circuit. The high-impedance state may be understood as an open circuit during circuit analysis. The floating state may also be referred to as a suspended state, and means that a node in a circuit is not connected to any potential. The floating state may be understood as an open circuit during circuit analysis.

Optionally, the touch key assembly 200 further includes an outer housing (not shown in the figure). The sensor 300 is attached to the outer housing. The outer housing and a housing of an electronic device may be an integrated structure. Alternatively, the outer housing and the housing of the electronic device may be separated. For example, a penetrating part may be provided on the housing of the electronic device, and the touch key assembly 200 (including the outer housing) may be disposed in the penetrating part. Optionally, the outer housing may be a part of the sensor 300, or may be separated from the sensor 300. Optionally, the sensor 300, the control circuit 400, and the outer housing may be integrated in one module, or may be separated from each other.

Optionally, the drive signal $S_d$ may be an alternating-current waveform, and the alternating-current waveform includes but is not limited to at least one of the following types: a square wave, a triangular wave, a sawtooth wave, a sine wave, and the like. In an example, the alternating-current waveform may be, for example, a square wave including several pulses. A frequency of the drive signal $S_d$ may be the same as or close to a resonance frequency of a composite resonator, to help drive the sensor 300 to vibrate along with the outer housing.

Optionally, the control circuit 400 may be a control chip of the sensor. For example, the control circuit 400 may serve as a control chip of the sensor, and be integrated in a same package with the sensor 300. Alternatively, the control circuit 400 and the sensor 300 may be separately packaged. The control circuit 400 may be integrated in a central processing unit, an application processor, or a coprocessor of the electronic device. The coprocessor (coprocessor) is a chip configured to relieve a specific processing task of a system microprocessor, and is a processor developed and used to assist the central processing unit in performing a processing job that cannot be performed by the central processing unit or that is performed with low efficiency or poor effects. Certainly, the control circuit 400 may be alternatively disposed as a hardware circuit independent of a main chip or a processor. Optionally, the control circuit 400 may include several separate elements, or may be implemented by one integrated chip. This is not limited in this embodiment of this application.

Optionally, if the control circuit 400 and a circuit unit for performing a function of the touch key assembly are disposed in different modules, the modules may be chips. For example, the control circuit 400 is a control chip packaged together with the sensor, and the circuit unit for performing the function of the touch key assembly is a processing chip of the electronic device, for example, the central processing unit, the coprocessor, or the application processor. In this case, the triggering an event may include: The control circuit 400 transmits a trigger signal. The circuit unit for performing the function of the touch key assembly receives the trigger signal, and performs, based on the trigger signal, a corresponding function such as power-on or volume adjustment.

Optionally, if the control circuit 400 includes a function of the central processing unit, the coprocessor, or the application processor, the triggering an event includes: The control circuit 400 performs the function of the touch key assembly.

Optionally, if the control circuit 400 includes the circuit unit for performing the function of the touch key assembly, the triggering an event may include: The control circuit 400 performs the function of the touch key assembly.

Optionally, in this embodiment of this application, the sensor 300 includes a tactile and force sensor. The tactile and force sensor includes a tactile sensor and/or a force sensor. In other words, the tactile and force sensor includes a function of a tactile sensor and/or a function of a force sensor. The tactile and force sensor may be configured to detect a touch force or a press force applied by a user. Common tactile and force sensors include a plurality of types, for example, a piezoelectric type, a piezocapacitive type, a piezoresistive type, an eddy effect type, an ultrasonic transmission type, and a fingerprint type. The piezocapacitive type sensor is commonly used in a touchscreen. The eddy effect type sensor is an inductive pressure sensor. In addition, to implement a time division multiplexing function for a single unit, a sensing unit of the sensor 300 may have a multi-function characteristic. For example, to implement time division multiplexing for two functions of driving the outer housing to vibrate and generating the vibration sensing signal $S_z$, the sensing unit is usually an electrical or magnetic deformation-reversible device, such as a piezoelectric element. The following provides descriptions with reference to embodiments.

FIG. 9 is a schematic structural diagram of a sensor 300 according to an embodiment of this application. As shown in FIG. 9, the sensor 300 includes an outer housing 31, a restrictive node 32, a bonding gel 33, a sensing unit 34, a first electrode 35, and a second electrode 36. Functions and structures of the units included in the sensor 300 are described below.

The outer housing 31 may be connected to the sensing unit 34 through bonding, a press fit, or an interference fit.

The restrictive node 32 is configured to limit a sensing region of the outer housing 31, to prevent a force or a deformation in the sensing region from spreading to another region. The restrictive node 32 may be formed by increasing a height of a periphery of the sensing region, making the periphery of the sensing region into a groove shape, or placing a damping material at the periphery of the sensing region. The restrictive node 32 is an important feature of providing the sensing region. The restrictive node 32 and the outer housing 31 may be made into an integrated structure. In other words, the restrictive node 32 may be a part of the outer housing 31.

Optionally, the outer housing 31 may serve as the outer housing 10 in the touch key assembly shown in FIG. 3 to FIG. 7. For example, the outer housing 31, the restrictive node 32, and a housing of an electronic device may be made into an integrated structure.

For the bonding gel 33, the bonding gel 33 is a cured gel configured to connect the outer housing 31 to the sensing unit 34.

The sensing unit 34 is a core unit of the sensor, and may be an electrical or magnetic deformation-reversible device. The electrical or magnetic deformation-reversible device may be a device made of an electrical or magnetic deformation-reversible material. A characteristic of the electrical or magnetic deformation-reversible material is as follows: Electricity or magnetism may cause a deformation of the material, and the deformation causes a change of an electrical or magnetic property of the material. The change of the electrical or magnetic property may include but is not limited to the following case: A voltage, a current, a charge, a resistance, a capacitance, an inductance, or a magnetic moment changes. A shape of the electrical or magnetic deformation-reversible device is not limited in this embodiment of this application. The electrical or magnetic deformation-reversible device may have a single-layer structure, a multi-layer structure, or various other shapes. The electrical or magnetic deformation-reversible device may include two electrodes. For example, FIG. 9 shows two electrodes: the first electrode 35 and the second electrode 36. One of the two electrodes may be configured to connect to ground or connect to a reference voltage, that is, the electrode is equivalent to the second port E. The other electrode is configured to receive a drive signal $S_d$ and/or output a vibration sensing signal $S_z$, that is, the electrode is equivalent to the first port A.

In an example, a typical electrical or magnetic deformation-reversible material includes a piezoelectric material, and the piezoelectric material may have a direct piezoelectric effect and an inverse piezoelectric effect. The direct piezoelectric effect means that a press force may generate a charge in the piezoelectric material. The inverse piezoelectric effect means that electricity may cause a deformation of the piezoelectric material. If the sensing unit 34 is made of the piezoelectric material, the sensing unit 34 may also be referred to as a piezoelectric unit or a piezoelectric device, and the sensor may be referred to as a piezoelectric sensor. For the piezoelectric sensor, through time division multiplexing for functions, only one piezoelectric unit is required to implement a driving function and a vibration sensing function. The inverse piezoelectric effect is used for the driving function, and the piezoelectric effect is used for the vibration sensing function, thereby simplifying a design of the sensor. Alternatively, the sensing unit 34 may be made of another type of electrical or magnetic deformation-reversible material. This is not limited in this embodiment of this application.

In an example, the sensing unit 34 may be a piezoelectric sheet. The piezoelectric sheet may have a single layer, two layers, or more layers. A shape of the piezoelectric sheet may be any shape such as a square shape, a circular shape, an elliptical shape, or a polygonal shape. A shape of the sensor 300 shown in FIG. 9 is a rectangular shape. A surface of the piezoelectric sheet may be connected to an inner surface of the outer housing 31 by using an adhesive or through an interference fit. The surface, of the piezoelectric sheet, that is bonded to the outer housing 31 is relatively flat.

It can be learned from the foregoing descriptions that, in addition to the electrode configured to connect to the ground or the reference voltage, the sensor 300 used in this application includes only one electrode, and is a sensor including a single unit, or may also be referred to as a single-output sensor. The sensor is simple to manufacture and has low costs, and is a general-purpose sensor. The single-output sensor with a simple structure may be used for the touch key assembly in this embodiment of this application, and detection by using the active method is implemented through time division multiplexing for functions of the sensor, thereby reducing costs and simplifying a circuit.

It should be noted that the description of the sensor 300 in FIG. 9 is merely an example, and the sensor 300 in this embodiment of this application may be alternatively another type of sensor, provided that the sensor can implement an electrical or magnetic deformation-reversible function.

FIG. 10 is a structural circuit diagram of a touch key assembly 200 according to an embodiment of this application. The touch key assembly 200 includes a sensor 300 and a control circuit 400. The control circuit 400 is connected to the sensor 300, and is configured to implement a driving function and a detection function for the sensor 300 through time division multiplexing. The touch key assembly 200 may also be referred to as a touch sensing module or a touch key assembly. Some or all of functions of the control circuit 400 may be integrated on one chip, or may be implemented by separate devices. For example, all or some of the functions of the control circuit 400 may be implemented by a microcontroller unit (microcontroller unit, MCU). Optionally, the control circuit 400 may be disposed on a printed circuit board (printed circuit board, PCB).

As shown in FIG. 10, the control circuit 400 includes a signal generation unit 40 and a detection unit 50. The signal generation unit 40 is connected to a first port A of the sensor 300. An output end of the signal generation unit 40 is configured to output a drive signal $S_d$ to the first port A of the sensor 300. The drive signal $S_d$ is an intermittent signal. The detection unit 50 is also connected to the first port A of the sensor 300. The detection unit 50 is configured to detect a vibration sensing signal $S_z$ output by the first port A of the sensor 300. If a user touches a region in which the sensor 300 is located, an amplitude of the vibration sensing signal $S_z$ is attenuated or increased. The detection unit 50 may determine an attenuation or increase degree of the vibration sensing signal $S_z$, to determine whether to trigger an event.

Optionally, the sensor 300 may be a sensor 300 including a single unit, that is, a single-output sensor. The sensor 300 includes the first port A and a second port E. The first port A is configured to receive the drive signal $S_d$ or transmit the vibration sensing signal $S_z$ in a time division manner. The second port E is configured to connect to ground or a reference voltage.

The drive signal $S_d$ is an intermittent signal. This may be understood as that the signal generation unit 40 outputs the drive signal $S_d$ in a first time interval, and output in a second time interval is in a high-impedance state or a floating state. The detection unit 50 detects, in the second time interval, the vibration sensing signal $S_z$ output by the sensor 300. The first time interval and the second time interval do not overlap. In other words, after outputting a segment of drive signal $S_d$, the signal generation unit 40 may quickly switch the output end to the high-impedance state or the floating state, and then the detection unit 50 detects the vibration sensing signal $S_z$ that is output by the sensor 300 in response to the drive signal $S_d$. Therefore, the control circuit 400 may input the drive signal $S_d$ and receive the vibration sensing signal $S_z$ at one end of the sensor 300. In other words, the drive signal $S_d$ and the high-impedance state (or floating state) are alternately output in time domain. For example, a drive signal $S_d$ with a length of 5 ms is output after every 10-ms high-impedance state (or floating state). In this embodiment of this application, time division multiplexing is performed on different functions of the sensor, and the touch key assembly is implemented by using the single-output sensor 300, thereby reducing costs, reducing complexity of a circuit design, and meeting requirements of high sensitivity and accidental triggering prevention.

Optionally, the drive signal $S_d$ and the high-impedance state (or floating state) may be alternately transmitted based on a period in time domain. For example, a drive signal $S_d$ with specific duration may be transmitted every 10 ms or 5 ms. Usually, a waveform and a period of a drive signal $S_d$ transmitted each time may remain the same, and duration of the drive signal $S_d$ transmitted each time may also remain the same. Alternatively, in some examples, a waveform, a period, or duration of a drive signal $S_d$ transmitted each time may vary. This is not limited in this embodiment of this application. In some examples, a frequency of the drive signal $S_d$ may be the same as or close to a resonance frequency of a composite resonator.

Optionally, the drive signal $S_d$ and the high-impedance state (or floating state) may be alternatively transmitted aperiodically in time domain. This is not limited in this embodiment of this application.

Optionally, the drive signal $S_d$ may be an alternating-current waveform, and the alternating-current waveform includes but is not limited to at least one of the following types, a square wave, a triangular wave, a sawtooth wave, a sine wave, and the like. In an example, the alternating-current waveform may be, for example, a square wave including several pulses. In an example, a resistance of the high-impedance state may be greater than 1 kilo ohm ($k\Omega$).

In this embodiment of this application, in the touch key assembly, the driving function and the vibration sensing function of the sensor may be combined into one through time division multiplexing. Therefore, only a single-output sensor is required to implement the two functions. This cannot only resist non-human accidental triggering, but also simplify the sensor used for the touch key assembly, thereby simplifying a structure of the touch key assembly.

In this embodiment of this application, a conventional single-output sensor may be used to implement the touch key assembly. In terms of device manufacturing, a common process may be used to implement the single-output sensor used in this embodiment of this application, to reduce costs for implementing the touch key assembly and improve device reliability.

It should be noted that, in some examples, when some human-body-like substances get in contact with a sensing region of the touch key assembly, an output amplitude of a device is greatly attenuated or increased compared with that when there is no contact. Therefore, to avoid mistakenly determining contact with a human-body-like substance as contact with a human body, the foregoing process of actively determining whether to trigger an event may be performed for a plurality of times, to avoid misjudgment.

FIG. 11 is a schematic structural diagram of a touch key assembly 200 according to another embodiment of this application. As shown in FIG. 11, the control circuit 400 further includes a first amplification unit 21. The first amplification unit 21 may be disposed between the sensor 300 and the detection unit 50. The first amplification unit 21 is configured to amplify the vibration sensing signal $S_z$ output by the sensor 300, and output a signal amplified based on the vibration sensing signal $S_z$. The detection unit 50 is configured to detect the amplified vibration sensing signal $S_z$.

In this embodiment of this application, the detection unit 50 detects the amplified vibration sensing signal $S_z$ output by the sensor 300. This helps more accurately and sensitively determine whether to trigger an event, thereby improving sensitivity and accidental triggering prevention performance of the touch key assembly.

FIG. 12 is a schematic structural diagram of a touch key assembly 200 according to another embodiment of this application. As shown in FIG. 12, the control circuit 400 further includes a filter unit 25. The filter unit 25 performs filtering processing on the vibration sensing signal $S_z$ output by the sensor 300. Optionally, the filter unit 25 may perform high-pass filtering on the vibration sensing signal $S_z$. The filter unit 25 may be alternatively integrated in the first amplification unit 21 or the detection unit 50. This is not limited in this embodiment of this application.

In this embodiment of this application, high-pass filtering on the vibration sensing signal $S_z$ may be implemented by using the filter unit, so that a baseline of the vibration sensing signal $S_z$ can be stabilized, and detection efficiency of the touch key assembly is improved.

In this embodiment of this application, a specific circuit structure of the signal generation unit 40, the detection unit 50, the first amplification unit 21, or the filter unit 25 is not limited, provided that the foregoing functions can be implemented. A person skilled in the art can understand that, when learning of the foregoing circuit functions, a person skilled in the art can obtain a specific circuit for implementing a corresponding circuit function.

In some examples, the signal generation unit 40 has a function of outputting the drive signal $S_d$ and can be switched to the high-impedance state or the floating state. The high-impedance state may be, for example, greater than 1 $k\Omega$, or may be a high-impedance state with another resistance.

In some examples, the first amplification unit 21 may include a circuit for implementing an amplification function. For example, the first amplification unit 21 may include but is not limited to at least one of the following devices: a charge amplifier, a current amplifier, an operational amplifier, a rectifier amplifier, a detection amplifier, a comparison amplifier, and the like.

In some examples, the detection unit 50 may include but is not limited to at least one of the following circuits: an analog-to-digital converter (analog to digital converter, ADC) circuit, a comparator, and the like.

In some examples, the filter unit 25 may include a simple first-order high-pass filter circuit, or may include a higher-order high-pass filter circuit. This is not limited in this embodiment of this application.

FIG. 13 is a schematic circuit diagram of a touch key assembly 200 according to another embodiment of this application. In FIG. 13, a signal generation unit and a detection unit in a control circuit are integrated in one control chip 500. The control chip 500 may be implemented by an MCU. FIG. 13 does not show the signal generation unit, the detection unit, or a connection relationship between functional units in the control chip 500. For the connection relationship between the functional units, refer to the descriptions in the foregoing specific embodiments. An IO port indicates an output end of the signal generation unit, and is configured to output a drive signal $S_d$. An AD port indicates an input end of the detection unit, and is configured to: after the signal generation unit is turned on, detect a vibration sensing signal $S_z$ that is output by a sensor 300 in response to the drive signal $S_d$.

Optionally, a first amplification unit 21 (an amplifier AMP) is disposed between the input end AD of the detection unit and the sensor 300, and is configured to amplify the vibration sensing signal $S_z$. A filter unit 25 may be further disposed between the input end AD of the detection unit and the sensor 300. The filter unit 25 includes a capacitor C and a resistor R. The filter unit 25 may be configured to perform high-pass filtering on the vibration sensing signal $S_z$. Alternatively, the filter unit 25 may be integrated in the first amplification unit 21 or the detection unit. This is not limited in this embodiment of this application. FIG. 13 shows merely an example of specific implementations of the foregoing functional units. A person skilled in the art can understand that the foregoing functional units alternatively have a plurality of other specific implementations or variations. All these implementations or variations shall fall within the protection scope of this application.

When the control chip 500 operates, the control chip 500 transmits an intermittent drive signal $S_d$ by using the IO port. For example, a drive signal $S_d$ with specific duration may be transmitted every 5 ms or 10 ms. A frequency of the drive signal $S_d$ may be the same as or close to a resonance frequency of a composite resonator. In this time period, the sensor implements a function of a driving unit. In an interval after the drive signal $S_d$ is transmitted, the IO port is in a high-impedance state or a floating state. In this stage, the control chip 500 detects the vibration sensing signal $S_z$ received by the AD port, and determines, based on the vibration sensing signal $S_z$, whether to trigger an event. The vibration sensing signal $S_z$ is a vibration coda wave response signal for the drive signal $S_d$. In this time period, the sensor implements a function of a vibration sensing unit.

In this embodiment of this application, drive signals $S_d$ are transmitted at intervals, that is, a drive signal $S_d$ is transmitted at an interval of a period of time. Therefore, user experience may be affected in a scenario in which a relatively high requirement is posed to a response speed of the touch key assembly. To avoid missing a trigger event, the signal generation unit needs to transmit a drive signal $S_d$ at an interval of a relatively short period of time. For example, a drive signal $S_d$ may be transmitted every 10 ms. However, in this manner, relatively high power consumption is caused.

To resolve this problem, the embodiments of this application further provide a further solution. FIG. 14 is a schematic structural diagram of a touch key assembly according to another embodiment of this application. As shown in FIG. 14, in this solution, in addition to a driving unit 61 and a vibration sensing unit 62, a sensor 300 further includes a force sensing unit 63. The force sensing unit 63 is configured to sense a force or a deformation, and output a force sensing signal $S_f$. First, a control circuit 400 detects, without transmitting a drive signal $S_d$, the force sensing signal $S_f$ output by the force sensing unit of the sensor. In this case, an output end of the control circuit 400 is in a high-impedance state or a floating state, and the driving unit 61 of the sensor 300 has not received a drive signal $S_d$. Therefore, this may be referred to as "passive" detection. When the control circuit 400 detects that a touch or press force on the force sensing of the sensor 300 exceeds a threshold, "active" detection is then enabled. During the "active" detection, if a user touches or presses a region in which the sensor 300 is located, an amplitude of the vibration sensing signal $S_z$ output by the sensor 300 is attenuated or increased, and the control circuit 400 may determine, based on an attenuation or increase degree of the detected vibration sensing signal $S_z$, whether to trigger an event. In this solution, the "active" detection and the "passive" detection are combined, the active detection is enabled by the passive detection, and the control circuit 400 does not need to continuously transmit the drive signal $S_d$ to the sensor 300, thereby reducing power consumption of the touch key assembly.

The combination of the active detection and the passive detection may be alternatively implemented by using a "unit function time division multiplexing technology". To be specific, one sensing unit performs different functions, such as a force sensing function, a driving function, or a vibration sensing function, in different time periods, to implement multi-functionalization of a single sensing unit. The sensing unit may be the foregoing electrical or magnetic deformation-reversible device, for example, a piezoelectric element. In other words, the sensor 300 in FIG. 14 may be alternatively implemented by the single-output sensor in the foregoing embodiments through time division multiplexing.

Optionally, a calculation unit may be added to the control circuit, to detect and/or calculate the force sensing signal $S_f$. The calculation unit may control, based on the detected force sensing signal $S_f$, a signal generation unit to turn on when a preset condition is met, so that the signal generation unit does not need to operate continuously, thereby reducing power consumption. Further, the control circuit may further include an interrupt unit. The interrupt unit is configured to control the calculation unit to turn on when a preset condition is met, thereby further reducing power consumption of the circuit. The following further describes the solutions in the embodiments of this application with reference to FIG. 15 to FIG. 18.

FIG. 15 is a schematic structural diagram of a touch key assembly 200 according to another embodiment of this application. As shown in FIG. 15, the control circuit 400 includes a signal generation unit 40, a detection unit 50, and a calculation unit 60. When sensing a force, a sensor 300 is deformed, and outputs a force sensing signal $S_f$ corresponding to the deformation. The calculation unit 60 is configured to detect the force sensing signal $S_f$ generated by the sensor 300. In this time period, the sensor 300 implements a function of a force sensing unit. When the force sensed by the sensor 300 exceeds a threshold, the calculation unit 60 transmits an indication signal to the signal generation unit 40, to indicate the signal generation unit 40 to turn on. In this time period, the sensor 300 implements a function of a driving unit. In an interval after a drive signal $S_d$ is transmitted, the detection unit 50 detects a vibration sensing signal $S_z$ output by the sensor 300, and determines, based on the vibration sensing signal $S_z$, whether to trigger an event. In this time period, the sensor 300 implements a function of a vibration sensing unit. In this manner, the signal generation unit 40 does not need to operate continuously, and therefore does not need to frequently transmit drive signals $S_d$, thereby reducing power consumption.

It should be noted that the force sensing signal $S_f$ detected by the calculation unit 60 is generated when the signal generation unit 40 is not operating, and therefore the force sensing signal $S_f$ detected by the calculation unit 60 is not a response signal for the drive signal $S_d$. This detection mode is referred to as "passive" detection. However, the vibration sensing signal $S_z$ detected by the detection unit 50 is responsive to the drive signal $S_d$. This detection mode is referred to as "active" detection. In this embodiment of this application, the "active" detection and the "passive" detection are combined, and the "active" detection is enabled by the "passive" detection, so that the circuit does not need to always keep the "active" detection enabled, thereby reducing power consumption.

In some examples, the calculation unit 60 may be configured to determine whether a currently sensed press force meets an active starting condition. If the active starting condition is met, the calculation unit 60 indicates the signal generation unit 40 to start to operate. If the active starting condition is not met, the signal generation unit 40 does not operate.

Optionally, the foregoing manner of determining whether the active starting condition is met may include determining whether a force sensed by the force sensing unit 63 exceeds a specified active starting threshold, or may include determining, based on a pressing form of a force sensed by the force sensing unit 63, whether the active starting condition is met, for example, double-tap or touch-and-hold.

In some other examples, the calculation unit 60 may perform determining in two steps. First, the calculation unit 60 may determine whether the force sensing signal $S_f$ meets a calculation starting condition. If the calculation starting condition is met, the calculation unit 60 starts to calculate a force or an accelerating force based on the force sensing signal $S_f$, and continues to determine whether the calculated force or accelerating force meets the active starting condition. If the active starting condition is met, the calculation unit 60 indicates the signal generation unit 40 to start to operate. If the force sensing signal $S_f$ does not meet the calculation starting condition, the calculation unit 60 does not need to calculate a force or an accelerating force and determine whether the force or the accelerating force meets the active starting condition.

Optionally, the foregoing manner of determining whether the calculation starting condition is met may include determining whether a force sensed by the force sensing unit 63 exceeds a specified calculation starting threshold, or may include determining, based on a pressing form of a force sensed by the force sensing unit 63, whether the calculation starting condition is met, for example, double-tap or touch-and-hold.

Values of the calculation starting threshold and the active starting threshold may be determined based on actual application. This is not limited in this embodiment of this application. In some examples, the calculation starting threshold may be a threshold for starting the calculation of the force or the accelerating force. The active starting threshold may be a threshold for enabling "active" detection. For example, the calculation starting threshold may be set to a value that is obtained by the calculation unit and that corresponds to 100 gram-force, and the active starting threshold may be set to a value that is obtained by the calculation unit and that corresponds to 200 gram-force. If the calculation starting condition is met, the calculation unit 60 starts to calculate a force or an accelerating force and determines whether the calculated force or accelerating force meets the active starting condition. When the force or the accelerating force meets the active starting condition, the signal generation unit 40 starts to operate. The value obtained by the calculation unit may be a dimension used by the calculation unit to determine the force or the accelerating force based on the force sensing signal $S_f$.

In a specific example, after initialization, the calculation unit 60 may read, at an interval of a period of time, a force sensing signal $S_f$ output by the sensor 300. In this case, output of the signal generation unit 40 is in a high-impedance state or a floating state. If the force sensing signal $S_f$ meets the calculation starting condition, the calculation unit 60 starts to calculate a force or an accelerating force. In this time period, the sensor 300 implements a function of a force sensing unit. After calculating the force or the accelerating force, the calculation unit 60 transmits an indication signal to the signal generation unit 40 if an obtained calculation result meets a condition for "active" detection, that is, the force or the accelerating force meets the active starting condition. The indication signal is used to indicate the signal generation unit 40 to start to operate, that is, the signal generation unit 40 starts to input an intermittent drive signal $S_d$ to the sensor 300. The drive signal $S_d$ drives a composite resonator to vibrate, so that the sensor 300 outputs a vibration sensing signal $S_z$ in response to the drive signal $S_d$. In a time period in which an output end of the signal generation unit 40 is switched to a high-impedance state or a floating state, the detection unit 50 detects the vibration sensing signal $S_z$ output by the sensor 300, and determines, based on an attenuation or increase degree of the vibration sensing signal $S_z$, whether to trigger an event. In this time period, the sensor 300 implements functions of a driving unit and a vibration sensing unit in a time division manner. A specific implementation herein is similar to that in the foregoing embodiments. Details are not described herein again.

Optionally, the calculation unit 60 may read, based on a specific time interval, a vibration sensing signal S-e generated by the sensor 300, for example, perform reading once every 5 ms or 10 ms.

In this embodiment of this application, the control circuit of the touch key assembly includes the calculation unit, and the calculation unit is configured to detect a touch or press force status of the sensor when no drive signal $S_d$ is received, to determine whether to turn on the signal generation unit. Therefore, the signal generation unit is turned on and transmits an intermittent drive signal $S_d$ only when a preset condition is met, thereby reducing power consumption of the circuit.

Optionally, as shown in FIG. 15, a first amplification unit 21 may be disposed between the detection unit 50 and the sensor 300. The first amplification unit 21 is located between the sensor 300 and the detection unit 50, and is configured to amplify the vibration sensing signal $S_z$ output by the sensor 300. A second amplification unit 22 may be further disposed between the calculation unit 60 and the sensor 300. The second amplification unit 22 is located between the sensor 300 and the calculation unit 60, and is configured to amplify the force sensing signal $S_f$ output by the sensor 300.

The calculation unit 60 may detect an amplified force sensing signal $S_f$, to determine whether to turn on the signal generation unit 40.

In this embodiment of this application, the second amplification unit is disposed, so that the calculation unit may detect the amplified force sensing signal $S_f$ output by the sensor. This helps more accurately and sensitively determine whether to trigger an event, thereby improving sensitivity and accidental triggering prevention performance of the touch key assembly.

In some examples, the first amplification unit 21 and the second amplification unit 22 each may include a circuit for implementing an amplification function. For example, the first amplification unit 21 and the second amplification unit 22 each may include but is not limited to at least one of the following devices: a charge amplifier, a current amplifier, an operational amplifier, a rectifier amplifier, a detection amplifier, a comparison amplifier, and the like.

FIG. 16 is a schematic circuit diagram of a touch key assembly 200 according to another embodiment of this application. In FIG. 16, a signal generation unit, a detection unit, and a calculation unit may be integrated in one control chip 500. The control chip 500 may be implemented by an MCU. FIG. 16 does not show structures of the signal generation unit, the detection unit, and the calculation unit, or a connection relationship between functional units in the control chip 500. For the connection relationship between the functional units, refer to the descriptions in the foregoing embodiments. An IO port indicates an output end of the signal generation unit, and is configured to output a drive signal $S_d$. An AD1 port indicates an input end of the calculation unit, and is configured to detect a force sensing signal $S_f$ output by a sensor 300. An AD2 port indicates an input end of the detection unit, and is configured to: after the signal generation unit is turned on, detect a vibration sensing signal S7 that is output by the sensor 300 in response to the drive signal $S_d$.

Optionally, a second amplification unit 22 (an amplifier AMP1) is disposed between the input end AD1 of the calculation unit and the sensor 300, to amplify the force sensing signal $S_f$. A first amplification unit 21 (an amplifier AMP2) is disposed between the input end AD2 of the detection unit and the sensor 300, to amplify the vibration sensing signal $S_z$. A filter unit 25 may be further disposed between the input end AD2 of the detection unit and the sensor 300. The filter unit 25 includes a capacitor C and a resistor R. The filter unit 25 may be used for high-pass filtering. Alternatively, the filter unit 25 may be integrated in the first amplification unit 21 or the detection unit. This is not limited in this embodiment of this application. FIG. 16 shows merely an example of specific implementations of the foregoing functional units. A person skilled in the art can understand that the foregoing functional units alternatively have a plurality of other specific implementations or variations. All these implementations or variations shall fall within the protection scope of this application.

When the control chip 500 operates, an initial state of the IO port is a high-impedance state or a floating state. The control chip 500 detects, at an interval of a period of time, a force sensing signal $S_f$ input to the AD1 port, to determine whether a force applied to the sensor 300 meets a calculation starting condition. The control chip 500 may periodically detect a force sensing signal $S_f$ input to the AD1 port, for example, may perform detection once every 5 ms or 10 ms. If the force sensing signal $S_f$ meets the calculation starting condition, the control chip 500 starts to calculate, based on the force sensing signal $S_f$ input to the AD1 port, a force or an accelerating force applied to the sensor 30), and determines whether the force or the accelerating force meets an active starting condition. In this time period, the sensor 300 implements a function of a force sensing unit. If the active starting condition is met, the control chip 500 transmits an intermittent drive signal $S_d$ by using the IO port. In this time period, the sensor 300 implements a function of a driving unit. In an interval after a drive signal $S_d$ is transmitted each time, the IO port is in a high-impedance state or a floating state. In this stage, the control chip 500 detects a vibration sensing signal $S_f$ input to the AD2 port, and determines, based on the vibration sensing signal $S_z$, whether to trigger an event. In this time period, the sensor 300 implements a function of a vibration sensing unit. In this embodiment of this application, time division multiplexing is performed on a force sensing function, a driving function, and a vibration sensing function of the sensor 300, so that a single-output sensor is used to implement a touch key assembly solution in which active detection and passive detection are combined.

FIG. 17 is a schematic structural diagram of a touch key assembly 200 according to another embodiment of this application. As shown in FIG. 17, the control circuit 400 includes a signal generation unit 40, a detection unit 50, a calculation unit 60, and an interrupt unit 70. The interrupt unit 70 is configured to detect a force sensing signal $S_f$ output by a sensor 300, and control the calculation unit 60 to turn on. Specifically, the interrupt unit 70 may implement a function of determining whether the force sensing signal $S_f$ meets a calculation starting condition. When the force sensing signal $S_f$ meets the calculation starting condition, the interrupt unit 70 may control the calculation unit 60 to turn on. Then the calculation unit 60 calculates, based on the force sensing signal $S_f$, a force or an accelerating force applied to the sensor 300, and determines whether the calculated force and/or accelerating force meet/meets an active starting condition. If the active starting condition is met, the calculation unit 60 transmits an indication signal to the signal generation unit 40, to indicate the signal generation unit 40 to start to operate.

This may be understood as that the interrupt unit 70 in FIG. 17 implements a function of determining whether the force sensing signal $S_f$ meets the calculation starting condition, and the calculation unit 60 implements a function of calculating the force or the accelerating force and determining whether the force or the accelerating force meets the active starting condition.

In this embodiment of this application, the interrupt unit 70 controls the calculation unit 60 to turn on, and the calculation unit 60 controls the signal generation unit 40 to turn on. Therefore, the calculation unit 60 and the signal generation unit 40 operate only when a preset condition is met, thereby reducing power consumption of the circuit.

Optionally, the interrupt unit 70 may be implemented by an interrupt circuit.

The interrupt circuit is switched on only when an input voltage or current meets a preset condition. A type of the interrupt circuit may be a level interrupt, a rising edge interrupt, or a falling edge interrupt. If the force sensing signal $S_f$ output by the sensor 300 meets a pre-designed level requirement, rising edge requirement, or falling edge requirement, an interrupt program is started. The calculation unit 60 is connected to the interrupt unit 70. The calculation unit 60 is turned on after the interrupt program is started. In other words, the interrupt unit 70 is equivalent to a switch for controlling the calculation unit 60. The calculation unit 60 starts to operate only when the interrupt unit 70 is turned on.

The interrupt unit 70 may be designed, so that after a press force sensed by the sensor 300 meets the calculation starting condition, a voltage value of a force sensing signal $S_f$ output by the force sensing unit 63 is greater than a starting voltage of the interrupt unit 70, and the interrupt unit 70 is turned on. The interrupt unit 70 is connected to the calculation unit 60. The calculation unit 60 starts to operate only when the interrupt unit 70 is turned on. Optionally, that the interrupt unit 70 determines whether the press force sensed by the sensor 300 meets the calculation starting condition may also be understood as that the interrupt unit 70 determines whether the force sensing signal $S_f$ output by the sensor 300 meets an interrupt condition.

Therefore, when a touch or press force applied to the sensor 300 does not meet the calculation starting condition, the interrupt unit 70 is not turned on, and the control circuit 400 hardly has power consumption. The interrupt unit 70 is turned on only when the touch or press force meets the calculation starting condition, and correspondingly, the calculation unit 60 is turned on to start to operate. Therefore, in the solution in this embodiment of this application, power consumption of the circuit can be reduced while a good accidental triggering prevention property is achieved.

Optionally, a third amplification unit 23 may also be disposed between the interrupt unit 70 and the sensor 300. The interrupt unit 70 receives and detects a force sensing signal $S_f$ amplified by the third amplification unit 23. A design may be adopted, so that when a press force applied to the sensor 300 meets the calculation starting condition, the amplified force sensing signal $S_f$ enables the interrupt unit 70 to start the interrupt program.

In some examples, the third amplification unit 23 may include a circuit for implementing an amplification function. For example, the third amplification unit 23 may include but is not limited to at least one of the following devices: a charge amplifier, a current amplifier, an operational amplifier, a rectifier amplifier, a detection amplifier, a comparison amplifier, and the like.

FIG. 18 is a schematic circuit diagram of a touch key assembly 200 according to another embodiment of this application. In FIG. 18, a signal generation unit, a detection unit, a calculation unit, and an interrupt unit may be integrated in one control chip 500. The control chip 500 may be implemented by an MCU. FIG. 18 does not show the signal generation unit, the calculation unit, the detection unit, the interrupt unit, or a connection relationship between functional units in the control chip 500. For the connection relationship between the functional units, refer to the descriptions in the foregoing specific embodiments. An IO port indicates an output end of the signal generation unit, and is configured to output a drive signal $S_d$. An INT port indicates an input end of the interrupt unit, and is configured to detect a force sensing signal $S_f$ output by a sensor 300, and determine whether to turn on the calculation unit. An AD1 port indicates an input end of the calculation unit, and is configured to detect the force sensing signal $S_f$ output by the sensor 300, and determine whether to turn on the signal generation unit so that the IO port outputs an intermittent drive signal $S_d$. An AD2 port indicates an input end of the detection unit, and is configured to: after the signal generation unit is turned on, detect a vibration sensing signal $S_z$ that is output by the sensor 300 in response to the drive signal $S_d$, and determine whether to trigger an event.

The interrupt unit transmits an interrupt signal only when the interrupt unit detects that the force sensing signal $S_f$ meets a calculation starting condition, so that the calculation unit starts to operate. In other words, when a press force sensed by the sensor 300 meets the calculation starting condition, the calculation unit is turned on, and then the calculation unit starts to calculate a force and/or an accelerating force applied to the sensor 300, and determines, based on the obtained force and/or accelerating force, whether an active starting condition is met. If the active starting condition is met, the calculation unit transmits an indication signal to the signal generation unit, to indicate the signal generation unit to start to operate.

Optionally, a second amplification unit 22 (an amplifier AMP1) is disposed between the input end AD1 of the calculation unit and the sensor 300, and is configured to amplify the force sensing signal $S_f$. A first amplification unit 21 (an amplifier AMP2) is disposed between the input end AD2 of the detection unit and the sensor 300, and is configured to amplify the vibration sensing signal $S_z$. A third amplification unit 23 (an amplifier AMP3) may be further disposed between the input end INT of the interrupt unit and the sensor 300, to amplify the force sensing signal $S_f$. A filter unit 25 may be further disposed between the input end AD2 of the detection unit and the sensor 300. The filter unit 25 includes a capacitor C and a resistor R. The filter unit 25 may be configured to perform high-pass filtering on the vibration sensing signal $S_z$. Alternatively, the filter unit 25 may be integrated in the first amplification unit 21 or the detection unit. This is not limited in this embodiment of this application. FIG. 18 shows merely an example of specific implementations of the foregoing functional units. A person skilled in the art can understand that the foregoing functional units alternatively have a plurality of other specific implementations or variations. All these implementations or variations shall fall within the protection scope of this application.

When the control chip 500 operates, an initial state of the IO port is a high-impedance state or a floating state. The control chip 500 detects the force sensing signal $S_f$ input to the INT port. When the force sensing signal $S_f$ does not meet the calculation starting condition, the force sensing signal $S_f$ is not sufficient to start an interrupt program, and none of the functional units operates. When the force sensing signal $S_f$ meets the calculation starting condition, the control chip 500 starts the interrupt program, and the control chip 500 starts to calculate, based on the force sensing signal $S_f$ input to the AD1 port, a force or an accelerating force applied to the sensor 300, and determines whether the force or the accelerating force meets an active starting condition. In this time period, the sensor 300 implements a function of a force sensing unit. If the active starting condition is met, the control chip 500 starts to transmit an intermittent drive signal $S_d$ by using the IO port. In this time period, the sensor 300 implements a function of a driving unit. In an interval after the drive signal $S_d$ is transmitted, the IO port is in a high-impedance state or a floating state. In this stage, the control chip 500 detects a vibration sensing signal $S_z$ input to the AD2 port, and determines, based on the vibration sensing signal $S_T$, whether to trigger an event. The vibration sensing signal $S_z$ is a coda wave response signal for the drive signal $S_d$. In this time period, the sensor 300 implements a function of a vibration sensing unit. Therefore, through time division multiplexing on different functions of the sensor 300, a touch key assembly technology is implemented, and design difficulty of the sensor 300 is reduced.

A person of ordinary skill in the art may be aware that, in combination with the examples described in the embodiments disclosed in this specification, units and algorithm steps may be implemented by electronic hardware or a combination of computer software and electronic hardware.

Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electronic device, comprising:
an outer housing;
a sensor comprising a first port and configured to:
   detect a force or deformation; and
   output, using the first port, a force sensing signal ($S_f$) of the force or the deformation;
a control circuit coupled to the sensor and configured to:
   detect the $S_f$;
   determine whether the $S_f$ meets an active starting condition; and
   output a drive signal ($S_d$) to the first port of the sensor in a first time interval and output a high-impedance state or a floating state in a second time interval when the $S_f$ meets the active starting condition,
wherein the sensor is further configured to:
   receive, by the first port, the $S_d$ in the first time interval;
   drive, in response to the $S_d$, the sensor to vibrate along with the outer housing;
   detect, vibration of the outer housing; and
   output, in response to the vibration and using the first port, a vibration sensing signal ($S_z$) in a second time interval, wherein the $S_z$ is a vibration coda wave response signal output after the sensor receives the $S_d$, and
wherein the control circuit is further configured to:
   detect, from the sensor, the $S_z$ in the second time interval; and
   determine, based on the $S_z$, whether to trigger an event.

2. The electronic device of claim 1, wherein the control circuit comprises a first amplifier configured to amplify the $S_z$.

3. The electronic device of claim 1, wherein the control circuit comprises a filter configured to perform filtering processing on the $S_z$.

4. The electronic device of claim 1, wherein the control circuit further comprises a second amplifier configured to amplify the $S_f$.

5. The electronic device of claim 1, wherein the control circuit is further configured to:
determine whether the $S_f$ meets a calculation starting condition;
calculate, based on the $S_f$ and when the $S_f$ meets the calculation starting condition, the force, an accelerating force, or the force and the accelerating force sensed by the sensor;
determine whether the force meets, the accelerating force meets, or the force and the accelerating force meet the active starting condition; and
transmit the $S_d$ to the sensor when the force meets, the accelerating force meets, or the force and the accelerating force meet the active starting condition.

6. The electronic device of claim 1, wherein the control circuit is further configured to:
start an interrupt program when the $S_f$ meets a calculation starting condition; and
after the interrupt program is started, calculate, based on the $S_f$, the force, an accelerating force, or the force and the accelerating force sensed by the sensor, determine whether the force, the accelerating force, or the force and the accelerating force meet the active starting condition, and transmit the $S_d$ when the force, the accelerating force, or the force and the accelerating force meet the active starting condition.

7. The electronic device of claim 1, wherein the sensor further comprises an electrical device or a magnetic deformation-reversible device.

8. The electronic device of claim 1, wherein the sensor comprises a piezoelectric device.

9. The electronic device of claim 1, wherein the sensor further comprises a second port, and wherein the second port is a common end.

10. The electronic device of claim 1, wherein the control circuit comprises a processing chip.

11. The electronic device of claim 1, wherein the control circuit comprises a control chip.

12. The electronic device of claim 1, wherein the electronic device comprises a housing, and wherein the outer housing is a part of the housing.

13. The electronic device of claim 1, wherein the outer housing houses the sensor.

14. A control circuit, comprising:
a memory configured to store instructions; and
a processor coupled to the memory and configured to execute the instructions to cause the control circuit to:
   receive a force sensing signal ($S_f$) from a sensor, wherein the $S_f$ is configured to indicate a force or deformation of the sensor;

determine whether the $S_f$ meets an active starting condition;

output a drive signal ($S_d$) to a first port of the sensor in a first time interval, wherein the $S_d$ is configured to drive the sensor to vibrate and output a high-impedance state or a floating state in a second time interval when the $S_f$ meets the active starting condition;

detect, in the second time interval, a vibration sensing signal ($S_z$) from the sensor, wherein the $S_z$ is a vibration coda wave response signal output after the sensor receives the $S_d$; and determine, based on the $S_z$, whether to trigger an event.

15. The control circuit of claim 14, wherein the control circuit further comprises a first amplifier configured to amplify the $S_z$.

16. The control circuit of claim 14, wherein the control circuit further comprises a filter configured to perform filtering processing on the $S_z$.

17. The control circuit of claim 14, wherein the control circuit further comprises a first amplifier configured to amplify the $S_f$.

18. The control circuit of claim 14, wherein the processor is further configured to execute the instructions to cause the control circuit to:

determine whether the $S_f$ meets a calculation starting condition;

calculate, based on the $S_f$ and when the $S_f$ meets the calculation starting condition, the force, an accelerating force, or the force and the accelerating force sensed by the sensor;

determine whether the force, the accelerating force, or the force and the accelerating force meet the active starting condition; and transmit the $S_d$ to the sensor when the force, the accelerating force, or the force and the accelerating force meet the active starting condition.

19. A computer program product comprising instructions stored on a non-transitory computer-readable medium that, when executed by a processor, cause a control circuit to:

receive a force sensing signal ($S_f$) from a sensor, wherein the Sf is configured to indicate a force or deformation of the sensor;

determine whether the $S_f$ meets an active starting condition;

output a drive signal ($S_d$) to a first port of the sensor in a first time interval, wherein the $S_d$ is configured to drive the sensor to vibrate and output a high-impedance state or a floating state in a second time interval when the $S_f$ meets the active starting condition;

detect, in the second time interval, a vibration sensing signal ($S_z$) from the sensor, wherein the $S_z$ is a vibration coda wave response signal after the sensor receives the $S_d$; and determine, based on the $S_z$, whether to trigger an event.

20. The computer program product of claim 19, wherein the processor is further configured to execute the instructions to amplify, using a first amplifier, the $S_z$.

* * * * *